United States Patent
Isokawa

(10) Patent No.: US 12,119,246 B2
(45) Date of Patent: Oct. 15, 2024

(54) METHOD, DEVICE, AND NON-TRANSITORY COMPUTER READABLE MEDIUM FOR DETERMINING TIMING OF REMOVING SUBSTRATE FROM CASSETTE IN SUBSTRATE PROCESSING DEVICE, AND SUBSTRATE PROCESSING DEVICE

(71) Applicant: EBARA CORPORATION, Tokyo (JP)

(72) Inventor: Hidetatsu Isokawa, Tokyo (JP)

(73) Assignee: EBARA CORPORATION, Tokyo (JP)

(*) Notice: Subject to any disclaimer, the term of this patent is extended or adjusted under 35 U.S.C. 154(b) by 414 days.

(21) Appl. No.: 17/492,700

(22) Filed: Oct. 4, 2021

(65) Prior Publication Data
US 2022/0139741 A1  May 5, 2022

(30) Foreign Application Priority Data
Oct. 30, 2020 (JP) .................................. 2020-182085

(51) Int. Cl.
| | |
|---|---|
| *G05B 19/418* | (2006.01) |
| *H01L 21/67* | (2006.01) |
| *H01L 21/677* | (2006.01) |

(52) U.S. Cl.
CPC ...... *H01L 21/67219* (2013.01); *G05B 19/418* (2013.01); *H01L 21/6704* (2013.01); *H01L 21/67742* (2013.01); *G05B 2219/32078* (2013.01)

(58) Field of Classification Search
None
See application file for complete search history.

(56) References Cited

U.S. PATENT DOCUMENTS

| | | | | |
|---|---|---|---|---|
| 6,074,276 A | * | 6/2000 | Shibata | B24B 37/005 451/60 |
| 6,201,999 B1 | * | 3/2001 | Jevtic | H01L 21/67276 414/217 |
| RE37,622 E | * | 4/2002 | Karlsrud | B24B 51/00 451/24 |
| 6,519,498 B1 | * | 2/2003 | Jevtic | G05B 19/41865 700/100 |
| 6,535,784 B2 | * | 3/2003 | Joma | G05B 19/41865 700/121 |
| 6,935,930 B2 | * | 8/2005 | Fujita | B24B 37/042 451/41 |
| 7,559,823 B2 | * | 7/2009 | Sato | B24B 37/345 451/41 |
| 8,206,197 B2 | | 6/2012 | Nakao et al. | |
| 10,688,622 B2 | | 6/2020 | Aono et al. | |

(Continued)

FOREIGN PATENT DOCUMENTS

| | | |
|---|---|---|
| JP | 2018006549 | 1/2018 |
| JP | 6370084 | 8/2018 |

*Primary Examiner* — Jason Lin
(74) *Attorney, Agent, or Firm* — JCIPRNET

(57) ABSTRACT

Provided is a method, device, and program for determining a timing of removing a substrate from a cassette in substrate processing device, and substrate processing device. In the method, a tentative removal time point of each substrate is calculated by adding a transfer time to a tentative removal time point of the one previous substrate, wherein the transfer time is required from the start of an action of removing a substrate from the cassette to the end of an action of delivering the substrate to an exchanger.

24 Claims, 24 Drawing Sheets

(56) References Cited

U.S. PATENT DOCUMENTS

| | | | |
|---|---|---|---|
| 2001/0018270 A1* | 8/2001 | Tsuchiya | C09G 1/02 |
| | | | 438/689 |
| 2002/0142568 A1* | 10/2002 | Chang | H01L 21/67276 |
| | | | 438/510 |
| 2003/0134570 A1* | 7/2003 | Hakomori | B24B 49/00 |
| | | | 451/41 |
| 2004/0106364 A1* | 6/2004 | Nagashima | B24B 37/04 |
| | | | 451/65 |
| 2007/0151866 A1* | 7/2007 | Wang | B24B 37/042 |
| | | | 438/692 |
| 2008/0081540 A1* | 4/2008 | Sato | H01L 21/67219 |
| | | | 451/178 |
| 2010/0130103 A1* | 5/2010 | Nakao | H01L 21/67276 |
| | | | 451/28 |
| 2014/0141541 A1* | 5/2014 | Tsai | H01L 21/6773 |
| | | | 156/345.1 |
| 2015/0122295 A1* | 5/2015 | Inoue | H01L 21/67276 |
| | | | 134/61 |
| 2015/0290766 A1* | 10/2015 | Sugiyama | B24B 53/007 |
| | | | 451/444 |

* cited by examiner

METHOD, DEVICE, AND NON-TRANSITORY COMPUTER READABLE MEDIUM FOR DETERMINING TIMING OF REMOVING SUBSTRATE FROM CASSETTE IN SUBSTRATE PROCESSING DEVICE, AND SUBSTRATE PROCESSING DEVICE

CROSS-REFERENCE TO RELATED APPLICATION

This application claims the priority benefit of Japan application serial no. 2020-182085, filed on Oct. 30, 2020. The entirety of the above-mentioned patent application is hereby incorporated by reference herein and made a part of this specification.

BACKGROUND

Technical Field

The disclosure relates to a method, a device, and a non-transitory computer readable medium for determining a timing of removing a substrate from a cassette in a substrate processing device, and relates to a substrate processing device.

Related Art

In recent years, a substrate processing device for performing various processing on a substrate such as a semiconductor wafer or the like is used. An example of the substrate processing device is a chemical mechanical polishing (CMP) device for performing polishing processing of a substrate.

A conventional CMP device includes a polishing portion for polishing a substrate, a cleaning portion for cleaning and drying the substrate, a loading/unloading portion which delivers the substrate to the polishing portion and receives the substrate that is cleaned and dried by the cleaning portion, and the like. In addition, the conventional CMP device includes a transfer portion which transfers the substrate in the polishing portion, the cleaning portion, and the loading/unloading portion, and various processing of polishing, cleaning, and drying is sequentially performed while the substrate is transferred by the transfer portion.

In this conventional CMP device, in a case where the polishing portion has a first polishing unit and a second polishing unit, when the substrate is polished by the first polishing unit, the substrate is directly carried from the loading/unloading portion into the first polishing unit, and when the substrate is polished by the second polishing unit, the substrate is carried from the loading/unloading portion into the second polishing unit via the first polishing unit (the substrate is not directly carried from the loading/unloading portion into the second polishing unit). Therefore, congestion occurs in the same carrying-in route part of the first polishing unit and the second polishing unit, and throughput is reduced.

In order to solve this problem, the present applicant has already proposed a new substrate processing device including a configuration in which substrates transferred from a transfer portion to a polishing portion are distributed into a first polishing unit and a second polishing unit by a transfer robot (see Patent literature 1). In this configuration, the first polishing unit and the second polishing unit do not share the substrate carrying-in route, and thus the congestion when the substrates are carried into the first polishing unit and the second polishing unit is eliminated. Thereby, the throughput of the entire process can be improved.

Meanwhile, when a plurality of substrates are continuously transferred in the CMP device, a standby state of the substrate may occur due to waiting for processing of a preceding substrate, waiting for a free processing portion shared with a substrate transferred on a different route, or the like. For example, when a standby state of the substrate occurs between the start of the polishing processing and the end of the cleaning processing, the state of the substrate may become unstable due to a temporal change (corrosion or the like) or disturbance (dust or the like). Particularly, when the substrate to be polished contains copper (Cu), an influence of the corrosion is increased if the standby time from the end of polishing to the start of cleaning is long.

In this regard, in order to avoid the standby time from the time when the substrate is input to the substrate processing device to the time when the cleaning processing is completed, Patent literature 2 proposes a technique, in which a tentative arrival time point of a newly input substrate to a polishing portion, a cleaning portion, and a transfer portion is calculated and is compared with a processing end time point of the one previous substrate which is previously input in the polishing portion, the cleaning portion, and the transfer portion, and when the tentative arrival time point of the newly input substrate is earlier than the processing end time point of the one previous substrate, the difference between the tentative arrival time point of the newly input substrate and the processing end time point of the one previous substrate is added to the tentative arrival time point (that is, the arrival time point is delayed by the difference) in order to avoid the standby from the time of arrival to the time when the processing of the one previous substrate is completed, and thereby an actual arrival time point is determined.

LITERATURE OF RELATED ART

Patent Literature

[Patent literature 1] Japanese Patent Laid-Open No. 2018-6549
[Patent literature 2] Japanese Patent No. 6370084

However, the technique of Patent literature 2 is a technique premised on the configuration of the conventional CMP device in which the substrate is carried from the loading/unloading portion into the second polishing unit via the first polishing unit when the substrate is polished by the second polishing unit, and the technique of Patent literature 2 cannot be applied to the configuration of the new substrate processing device in which the substrates transferred from the transfer portion to the polishing portion are distributed into the first polishing unit and the second polishing unit by the transfer robot.

SUMMARY

The disclosure provides a technique that can improve throughput in a substrate processing device having a configuration in which substrates transferred from a transfer portion to a polishing portion are distributed into a first polishing unit and a second polishing unit by a transfer robot.

A method according to a first aspect of the disclosure is a method for determining a timing of removing a substrate from a cassette in a substrate processing device, wherein the substrate processing device includes:
a polishing portion having a first polishing unit, a second polishing unit, and a transfer robot which distributes substrates into the first polishing unit and the second polishing unit, wherein each of the first polishing unit and the second polishing unit has two polishing devices, two pushers which are respectively arranged at two substrate transfer positions for each of the two polishing devices and move up and down, and an exchanger having stages that horizontally move between a standby position for delivering a substrate to the transfer robot and the two substrate transfer positions;
a loading/unloading portion which removes a substrate before polishing from a cassette; and
a transfer portion which transfers a substrate between the loading/unloading portion and the transfer robot;
wherein a tentative removal time point of each substrate is calculated by adding a transfer time to a tentative removal time point of the one previous substrate, wherein the transfer time required from the start of an action of removing a substrate from the cassette in the loading/unloading portion to the end of an action of delivering the substrate to the exchanger by the transfer robot,
a tentative time point A at which a lowering action of the pusher for delivering the Xth (X is an arbitrary natural number) substrate after polishing from the polishing device to the exchanger is completed is compared with a tentative time point B at which a delivery action of the transfer robot for delivering the (X+5)th substrate before polishing from the transfer portion to the exchanger is completed,
when A≤B, the tentative removal time point of each substrate is adopted as an actual removal time point, and
when A>B, an actual removal time point of the (10+4i)th (i is an integer greater than or equal to 0) substrate is calculated by adding the transfer time and further adding at least A−B to an actual removal time point of the one previous substrate, and an actual removal time point of the other substrates is calculated by adding the transfer time to an actual removal time point of the one previous substrate.

According to this aspect, immediately after the lowering action (unloading) of the pusher for delivering the 10+4(i−1)th substrate after polishing from the polishing device to the exchanger is completed, the substrate is stabilized, and a raising action (loading) of the same pusher for delivering the (10+4i)th substrate before polishing from the exchanger to the polishing device can be started. Similarly, immediately after the lowering action (unloading) of the pusher for delivering the (10+4(i−1)+k)th (k=1, 2, 3) substrate after polishing from the polishing device to the exchanger is completed, the substrate is stabilized, and the raising action (loading) of the same pusher for delivering the (10+4i+k)th substrate before polishing from the exchanger to the polishing device can be started. Therefore, the pusher-to-pusher action time (the time from the start of one substrate processing executed by the pusher to the start of another substrate processing next thereto) can be shorten, and thereby the rate controlling of the polishing portion can be minimized, and the throughput (WPH: Wafer Per Hour) can be improved. In addition, accordingly, the time from polishing to cleaning becomes uniform and the shortest for each wafer, and thus it is also possible to achieve a high level of stability in terms of process.

A method according to a second aspect of the disclosure is the method according to the first aspect,
wherein when A>B, the actual removal time point of the (10+4i)th substrate is calculated by adding the transfer time and further adding A−B+Δ to the actual removal time point of the one previous substrate, and the actual removal time point of the other substrates is calculated by adding the transfer time to the actual removal time point of the one previous substrate, and
the Δ is a predetermined value in consideration of the delay of a communication time in an actual machine.

A method according to a third aspect of the disclosure is the method according to the second aspect,
wherein the Δ is 1 second or less.

A method according to a fourth aspect of the disclosure is the method according to any one of the first to third aspects,
wherein the substrate processing device further includes a cleaning portion which cleans a substrate after polishing, and
the transfer robot delivers a substrate between the first polishing unit and the cleaning portion and between the second polishing unit and the cleaning portion.

A device according to a fifth aspect of the disclosure is a device which determines a timing of removing a substrate from a cassette in a substrate processing device,
wherein the substrate processing device includes:
a polishing portion having a first polishing unit, a second polishing unit, and a transfer robot which distributes substrates into the first polishing unit and the second polishing unit, wherein each of the first polishing unit and the second polishing unit has two polishing devices, two pushers which are respectively arranged at two substrate transfer positions for each of the two polishing devices and move up and down, and an exchanger having stages that horizontally move between a standby position for delivering a substrate to the transfer robot and the two substrate transfer positions; a loading/unloading portion which removes a substrate before polishing from a cassette; and
a transfer portion which transfers a substrate between the loading/unloading portion and the transfer robot;
wherein the device includes:
a memory which stores an instruction; and
at least one processor configured to execute the instruction, which is for:
calculating a tentative removal time point of each substrate by adding transfer time to a tentative removal time point of the one previous substrate, wherein the transfer time required from the start of an action of removing a substrate from the cassette in the loading/unloading portion to the end of an action of delivering the substrate to the exchanger by the transfer robot;
comparing a tentative time point A at which a lowering action of the pusher for delivering the Xth (X is an arbitrary natural number) substrate after polishing from the polishing device to the exchanger is completed with a tentative time point B at which a delivery action of the transfer robot for delivering the (X+5)th substrate before polishing from the transfer portion to the exchanger is completed;
when A≤B, adopting the tentative removal time point of each substrate as an actual removal time point; and
when A>B, calculating an actual removal time point of the (10+4i)th (i is an integer greater than or equal to 0) substrate by adding the transfer time and further adding at least A−B to an actual removal time point of the one previous substrate, and calculating an actual removal time point of the other substrates by adding the transfer time to an actual removal time point of the one previous substrate.

A device according to a sixth aspect of the disclosure is the device according to the fifth aspect,
which calculates the actual removal time point of the (10+4i)th (i is a natural number) substrate by adding the transfer time and further adding A−B+Δ to the actual removal time point of the one previous substrate, and calculates the actual removal time point of the other substrates by adding the transfer time to the actual removal time point of the one previous substrate when A>B,
wherein the Δ is a predetermined value in consideration of the delay of a communication time in an actual machine.

A device according to a seventh aspect of the disclosure is the device according to the sixth aspect, wherein the Δ is 1 second or less.

A device according to an eighth aspect of the disclosure is the device according to any one of the fifth to seventh aspects,
wherein the substrate processing device further includes a cleaning portion which cleans a substrate after polishing, and
the transfer robot delivers a substrate between the first polishing unit and the cleaning portion and between the second polishing unit and the cleaning portion.

A non-transitory computer readable medium according to a ninth aspect of the disclosure is storing a program for determining a timing of removing a substrate from a cassette in a substrate processing device,
wherein the substrate processing device includes:
a polishing portion having a first polishing unit, a second polishing unit, and a transfer robot which distributes substrates into the first polishing unit and the second polishing unit, wherein each of the first polishing unit and the second polishing unit has two polishing devices, two pushers which are respectively arranged at two substrate transfer positions for each of the two polishing devices and move up and down, and an exchanger having stages that horizontally move between a standby position for delivering a substrate to the transfer robot and the two substrate transfer positions;
a loading/unloading portion which removes a substrate before polishing from a cassette; and
a transfer portion which transfers a substrate between the loading/unloading portion and the transfer robot,
wherein the program causes a computer to execute:
calculation of a tentative removal time point of each substrate by adding a transfer time to a tentative removal time point of the one previous substrate, wherein the transfer time required from the start of an action of removing a substrate from the cassette in the loading/unloading portion to the end of an action of delivering the substrate to the exchanger by the transfer robot;
comparison of a tentative time point A at which a lowering action of the pusher for delivering the Xth (X is an arbitrary natural number) substrate after polishing from the polishing device to the exchanger is completed with a tentative time point B at which a delivery action of the transfer robot for delivering the (X+5)th substrate before polishing from the transfer portion to the exchanger is completed;

adoption of the tentative removal time point of each substrate as an actual removal time point when A≤B; and
calculation of an actual removal time point of the (10+4i)th (i is an integer greater than or equal to 0) substrate by adding the transfer time and further adding at least A−B to an actual removal time point of the one previous substrate, and calculation of an actual removal time point of the other substrates by adding the transfer time to an actual removal time point of the one previous substrate when A>B.

A non-transitory computer readable medium according to a tenth aspect of the disclosure is the non-transitory computer readable medium according to the ninth aspect,
wherein when A>B, the actual removal time point of the (10+4i)th substrate is calculated by adding the transfer time and further adding A−B+Δ to the actual removal time point of the one previous substrate, and the actual removal time point of the other substrates is calculated by adding the transfer time to the actual removal time point of the one previous substrate, and
the Δ is a predetermined value in consideration of the delay of a communication time in an actual machine.

A non-transitory computer readable medium according to an eleventh aspect of the disclosure is the non-transitory computer readable medium according to the tenth aspect,
wherein the Δ is 1 second or less.

A non-transitory computer readable medium according to a twelfth aspect of the disclosure is the non-transitory computer readable medium according to any one of the ninth to eleventh aspects,
wherein the substrate processing device further includes a cleaning portion which cleans a substrate after polishing, and
the transfer robot delivers a substrate between the first polishing unit and the cleaning portion and between the second polishing unit and the cleaning portion.

A substrate processing device according to a thirteenth aspect of the disclosure includes:
a polishing portion having a first polishing unit, a second polishing unit, and a transfer robot which distributes substrates into the first polishing unit and the second polishing unit, wherein each of the first polishing unit and the second polishing unit has two polishing devices, two pushers which are respectively arranged at two substrate transfer positions for each of the two polishing devices and move up and down, and an exchanger having stages that horizontally move between a standby position for delivering a substrate to the transfer robot and the two substrate transfer positions;
a loading/unloading portion which removes a substrate before polishing from a cassette; a transfer portion which transfers a substrate between the loading/unloading portion and the transfer robot; and
a control portion which controls a timing of removing a substrate from the cassette based on a timetable in which a processing end time point or a scheduled processing end time point in the polishing portion, the loading/unloading portion, and the transfer portion is associated with each substrate,
wherein in the timetable,
between a time point A at which a lowering action of the pusher for delivering the Xth (X is an arbitrary natural number) substrate after polishing from the polishing device to the exchanger is completed and a time point B at which a delivery action of the transfer robot for delivering the (X+5)th substrate before polishing from the transfer portion to the exchanger is completed, there is a relationship of A>B; and a removal time point of the (10+4i)th (i is an integer greater than or equal to 0) substrate is a time point obtained by adding a transfer time, which is required from the start of an action of removing a substrate from the cassette in the loading/unloading portion to the end of an action of delivering the substrate to the exchanger by the transfer robot, and further adding at least A−B to a removal time point of the one previous substrate, and a removal time point of the other substrates is a time point obtained by adding the transfer time to a removal time point of the one previous substrate.

A substrate processing device according to a fourteenth aspect of the disclosure is the substrate processing device according to the thirteenth aspect, wherein in the timetable, the actual removal time point of the (10+4i)th substrate is a time point obtained by adding the transfer time and further adding A−B+Δ to the removal time point of the one previous substrate, and the actual removal time point of the other substrates is a time point obtained by adding the transfer time to the removal time point of the one previous substrate, and the Δ is a predetermined value in consideration of the delay of a communication time in an actual machine.

A substrate processing device according to a fifteenth aspect of the disclosure is the substrate processing device according to the fourteenth aspect, wherein the Δ is 1 second or less.

A substrate processing device according to a sixteenth aspect of the disclosure is the substrate processing device according to any one of the thirteenth to fifteenth aspects, and further includes a cleaning portion which cleans a substrate after polishing, wherein the transfer robot delivers a substrate between the first polishing unit and the cleaning portion and between the second polishing unit and the cleaning portion.

DESCRIPTION OF THE EMBODIMENTS

Figure 1:
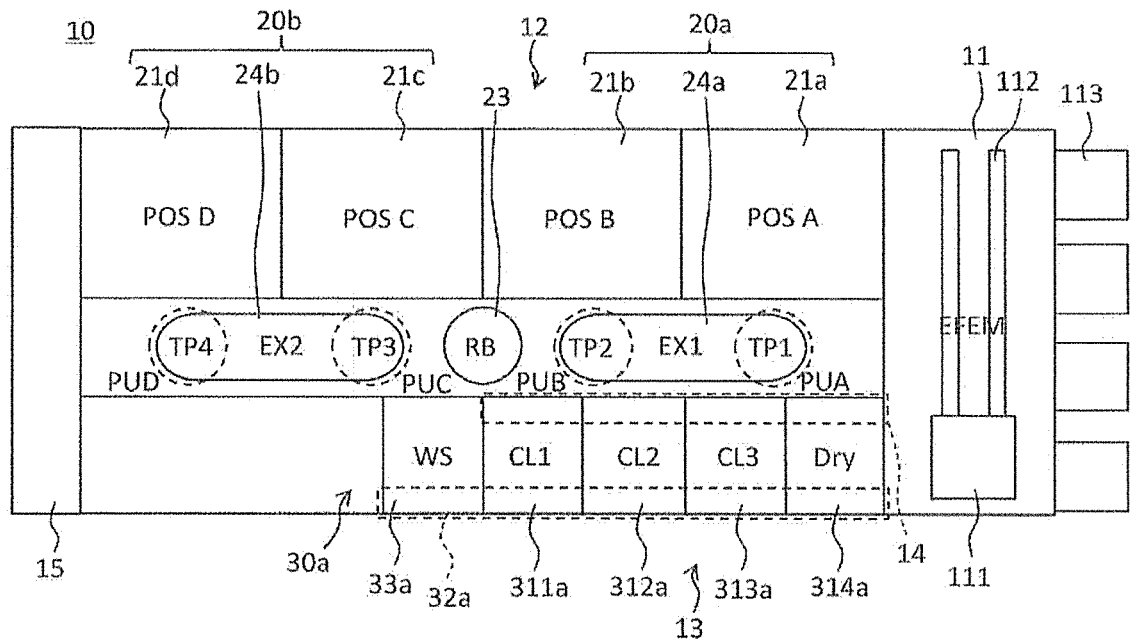
FIG. 1 is a plan view showing an entire configuration of a substrate processing device according to an embodiment.

An embodiment is described below with reference to drawings. Note that, in the following description and the drawings used in the following description, the same reference numerals are used for parts that can be configured identically, and duplicate description thereof is omitted.

Figure 2:
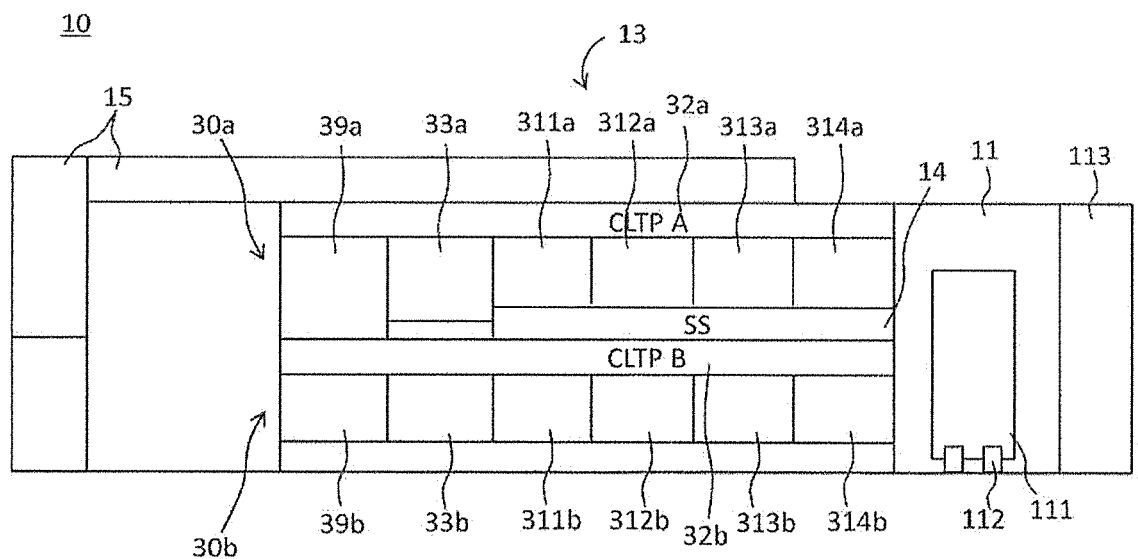
FIG. 2 is a side view of the substrate processing device shown in FIG. 1 as viewed from a cleaning portion side.

FIG. 1 is a plan view showing an entire configuration of a substrate processing device according to an embodiment, and FIG. 2 is a side view of the substrate processing device shown in FIG. 1 as viewed from a cleaning portion side. As shown in FIG. 1 and FIG. 2, a substrate processing device 10 in the embodiment includes a housing having a substantially rectangular shape in a plan view, and an interior of the housing is divided into a loading/unloading portion 11, a polishing portion 12, a cleaning portion 13, and a transfer portion 14 by partition walls. Each of the loading/unloading portion 11, the polishing portion 12, the cleaning portion 13, and the transfer portion 14 is assembled independently and exhausted independently. In addition, a control portion 15 (also referred to as a control panel) which controls actions of the loading/unloading portion 11, the polishing portion 12, the cleaning portion 13, and the transfer portion 14 is arranged in the substrate processing device 10.

<Loading/Unloading Portion>

The loading/unloading portion 11 includes a plurality of (four in the shown example) front loading portions 113 on which a wafer cassette stocking a large number of wafers (substrates) W is placed. These front loading portions 113 are arranged adjacent to each other in a width direction (a direction perpendicular to a longitudinal direction) of the substrate processing device 10. An open cassette, a standard manufacturing interface (SMIF) pod, or a front opening unified pod (FOUP) can be mounted on the front loading portion 113. Here, the SMIF pod and the FOUP are closed containers that accommodate the wafer cassette inside and can maintain an environment independent from an external space by covering the wafer cassette by a partition wall.

In addition, a traveling mechanism 112 is laid in the loading/unloading portion 11 along the arrangement direction of the front loading portion 113, and a transfer robot 111 capable of moving along the arrangement direction of the front loading portion 113 is set on the traveling mechanism 112. The transfer robot 111 can access the wafer cassette mounted on the front loading portion 113 by moving on the traveling mechanism 112. The transfer robot 111 includes two hands on upper and lower sides, and the upper and lower hands can be used differently, for example, the upper hand can be used when the wafer W is returned to the wafer cassette, and the lower hand can be used when the wafer W before polishing is transferred.

Moreover, alternatively, the wafer W may be transferred by only one single hand.

Because the loading/unloading portion 11 is a region that needs to be kept in a cleanest state, an interior of the loading/unloading portion 11 is constantly maintained at a pressure higher than that of any one of the device exterior, the polishing portion 12, the cleaning portion 13, and the transfer portion 14. In addition, a filter fan unit (not shown) having a clean air filter such as a HEPA filter, an ULPA filter, or the like is arranged above the traveling mechanism 112 of the transfer robot 111, and clean air from which particles, toxic steam, and gas are removed by this filter fan unit is constantly blown downward.

<Transfer Portion>

The transfer portion 14 is a region in which the wafer before polishing is transferred from the loading/unloading portion 11 to the polishing portion 12, and is arranged to extend along the longitudinal direction of the substrate processing device 10. As shown in FIG. 1, the transfer portion 14 is arranged adjacent to both the loading/unloading portion 11 which is the cleanest region and the polishing portion 12 which is the dirtiest region. Therefore, in order that particles in the polishing portion 12 do not diffuse into the loading/unloading portion 11 through the transfer portion 14, as described below, a flow of air which flows from the loading/unloading portion 11 side to the polishing portion 12 side is formed in an interior of the transfer portion 14.

Figure 3:
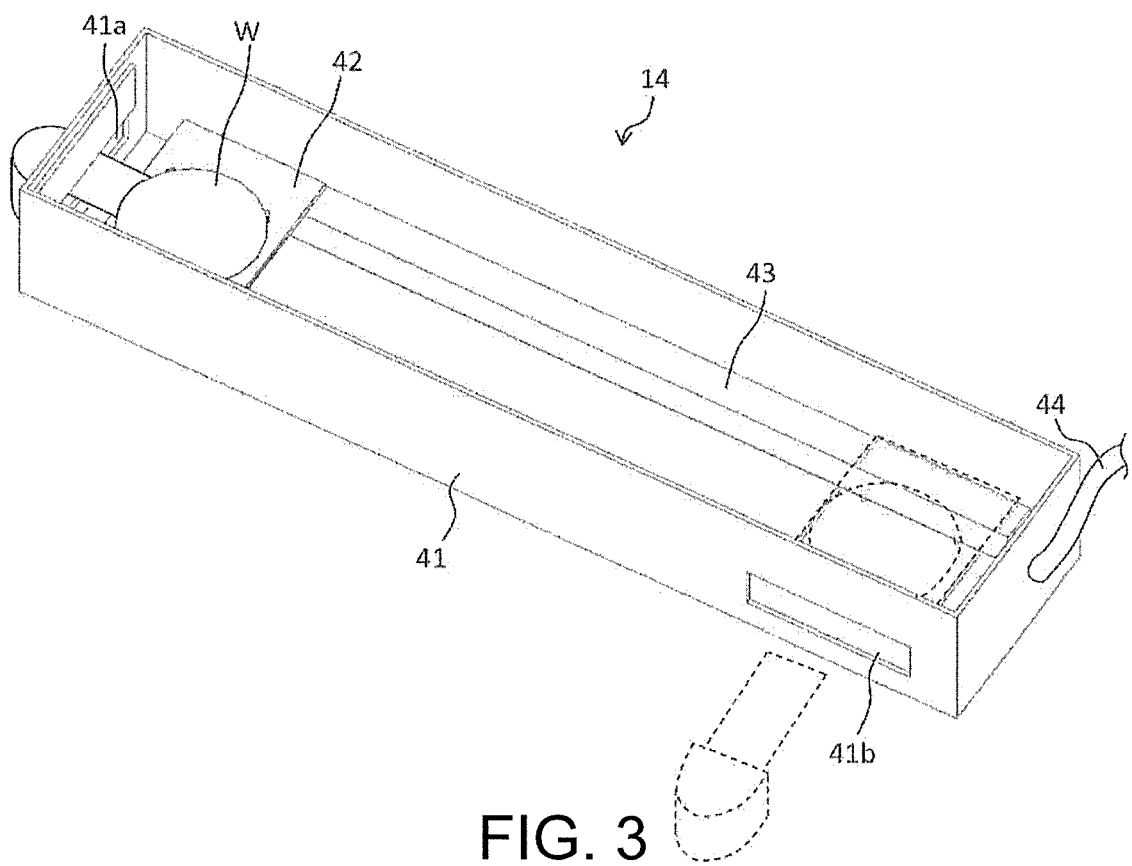
FIG. 3 is an exploded perspective view showing a transfer portion of the substrate processing device shown in FIG. 1.

A structure of the transfer portion 14 is described in detail. FIG. 3 is an exploded perspective view showing an internal configuration of the transfer portion 14. As shown in FIG. 3, the transfer portion 14 has a cover 41 extending in the longitudinal direction, a slide stage 42 which is arranged on an inner side of the cover 41 and holds the wafer W, a stage movement mechanism 43 which linearly moves the slide stage 42 along the longitudinal direction, and an exhaust duct 44 which exhausts the inner side of the cover 41.

The cover 41 has a bottom plate, four side plates, and a top plate (not shown in FIG. 3). A carrying-in port 41a communicating to the loading/unloading portion 11 is formed in one of these side plates in the longitudinal direction. In addition, the carrying-out port 41b communicating to the polishing portion 12 is formed at an end part of one side plate in the width direction, which is opposite to the carrying-in port 41a. The carrying-in port 41a and the carrying-out port 41b can be opened and closed by a shutter (not shown). The transfer robot 111 of the loading/unloading portion 11 is capable of accessing the slide stage 42 on the inner side of the cover 41 from the carrying-in port 41a, and a transfer robot 23 of the polishing portion 12 is capable of accessing the slide stage 42 on the inner side of the cover 41 from the carrying-out port 41b.

As the stage movement mechanism 43, for example, a motor-driven mechanism using a ball screw or an air cylinder is used. When a rodless cylinder is used as the stage movement mechanism 43, dust generation from a slide portion can be prevented, and thus it is preferable. The slide stage 42 is fixed to a movable part of the stage movement mechanism 43, and is linearly moved on the inner side of the cover 41 along the longitudinal direction by power given from the stage movement mechanism 43.

Four pins are arranged to protrude upward in an outer peripheral part of the slide stage 42. The wafer W placed on the slide stage 42 by the transfer robot 111 of the loading/unloading portion 11 is supported on the slide stage 42 in a state that an outer peripheral edge of the wafer W is guided and positioned by the four pins. These pins are formed from resins such as polypropylene (PP), polychlorotrifluoroethylene (PCTFE), polyetheretherketone (PEEK), and the like.

The exhaust duct 44 is arranged on the other side plate in the longitudinal direction (a side plate opposite to the carrying-in port 41a) of the cover 41. The exhaust is performed by the exhaust duct 44 in a state that the carrying-in port 41a is opened, and thereby a flow of air flowing from the carrying-in port 41a side to the carrying-out port 41b side is formed on the inner side of the cover 41. Thereby, the particles in the polishing portion 12 are prevented from diffusing into the loading/unloading portion 11 through the transfer portion 14.

<Polishing Portion>

As shown in FIG. 1, the polishing portion 12 is a region in which the polishing of the wafer W is performed, and has a first polishing unit 20a, a second polishing unit 20b, and the transfer robot 23 which distributes the substrates W transferred from the transfer portion 14 to the polishing portion 12 into the first polishing unit 20a and the second polishing unit 20b.

Among these units, the first polishing unit 20a has a first polishing device 21a, a second polishing device 21b, and a first transfer unit 24a which delivers the substrate W between the first polishing device 21a and the transfer robot 23 and between the second polishing device 21b and the transfer robot 23. In addition, the second polishing unit 20b has a third polishing device 21c, a fourth polishing device 21d, and a second transfer unit 24b which delivers the substrate W between the third polishing device 21c and the transfer robot 23 and between the fourth polishing device 21d and the transfer robot 23.

As shown in FIG. 1, the first polishing device 21a, the second polishing device 21b, the third polishing device 21c, and the fourth polishing device 21d are arranged along the longitudinal direction of the substrate processing device 10. Because the second polishing device 21b, the third polishing device 21c, and the fourth polishing device 21d have the same configuration as the first polishing device 21a, the first polishing device 21a is described below.

Figure 4:
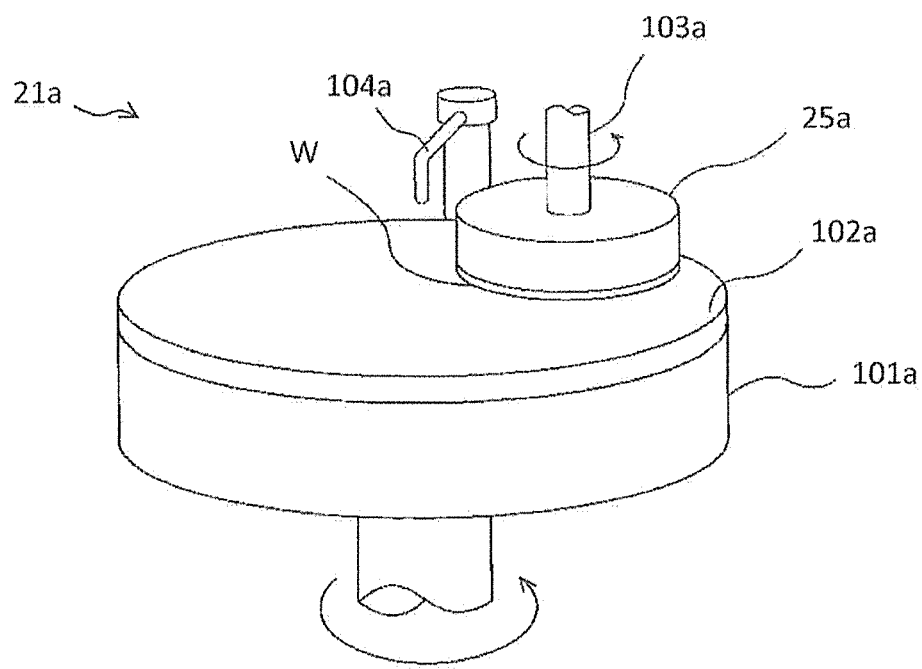
FIG. 4 is a perspective view schematically showing a first polishing device of the substrate processing device shown in FIG. 1.

FIG. 4 is a perspective view schematically showing the first polishing device 21a. The first polishing device 21a has a polishing table 101a to which a polishing pad 102a having a polishing surface is attached, a top ring 25a for holding the wafer W and polishing the wafer W while pressing the wafer W against the polishing pad 102a on the polishing table 101a, a polishing liquid supply nozzle 104a for suppling a polishing liquid (also referred to as slurry) and a dressing liquid (for example, pure water) to the polishing pad 102, a dresser (not shown) for dressing the polishing surface of the polishing pad 102a, and an atomizer (not shown) which atomizes a mixed gas of a liquid (for example, pure water) and a gas (for example, a nitrogen gas) or a liquid (for example, pure water) and injects the atomized mixed gas or the liquid onto the polishing surface.

Among these members, the top ring 25a is supported by a top ring shaft 103a. The polishing pad 102a is pasted to an upper surface of the polishing table 101a, and an upper surface of the polishing pad 102a configures the polishing surface for polishing the wafer W. Additionally, a fixed whetstone can also be used instead of the polishing pad 102a. The top ring 25a and the polishing table 101a are configured to rotate around axial centers thereof as shown by arrows in FIG. 4. The wafer W is held on a lower surface of the top ring 25a by vacuum adsorption. At the time of polishing, the polishing liquid is supplied from the polishing liquid supply nozzle 104a to the polishing surface of the polishing pad 102a, and the wafer W to be polished is pressed against the polishing surface by the top ring 25a and polished.

The polishing portion 12 is the dirtiest (grimiest) region as can be seen when considering the use of the slurry at the time of polishing. Therefore, in the embodiment, in order that the particles in the polishing portion 12 does not scatter to the exterior, the exhaust is performed from the periphery of each polishing table of the first polishing device 21a, the second polishing device 21b, the third polishing device 21c, and the fourth polishing device 21d, and the pressure inside the polishing portion 12 is made more negative than the pressure of the device exterior, the surrounding cleaning portion 13, the loading/unloading portion 11, and the transfer portion 14 to prevent the scattering of the particles. In addition, normally, an exhaust duct (not shown) is arranged below the polishing table, a filter (not shown) is arranged above the polishing table, the cleaned air is ejected via the exhaust duct and the filter, and a downflow is formed.

As shown in FIG. 1, the top ring 25a of the first polishing device 21a moves between a polishing position and a first substrate transfer position TP1 by a swing action of the top ring head, and the wafer delivery to the first polishing device 21a is performed at the first substrate transfer position TP1. Similarly, a top ring 25b of the second polishing device 21b moves between the polishing position and a second substrate transfer position TP2 by the swing action of the top ring head, and the wafer delivery to the second polishing device 21b is performed at the second substrate transfer position TP2. A top ring 25c of the third polishing device 21c moves between the polishing position and a third substrate transfer position TP3 by the swing action of the top ring head, and the wafer delivery to the third polishing device 21c is performed at the third substrate transfer position TP3. A top ring 25d of the fourth polishing device 21d moves between the polishing position and a fourth substrate transfer position TP4 by the swing action of the top ring head, and the wafer delivery to the fourth polishing device 21d is performed at the fourth substrate transfer position TP4.

As shown in FIG. 1, the transfer robot 23 is arranged between the first transfer unit 24a and the second transfer unit 24b, and performs the wafer delivery between the transfer portion 14 and the first transfer unit 24a and between the transfer portion 14 and the second transfer unit 24b. In the shown example, the transfer robot 23 is arranged approximately in the center of the housing of the substrate processing device 10.

Figure 5:
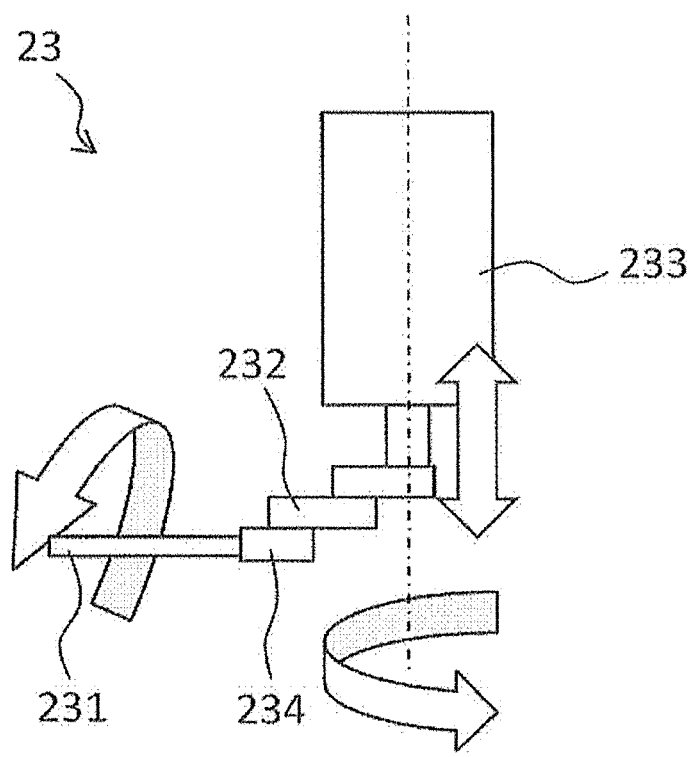
FIG. 5 is a side view of a transfer robot of the substrate processing device shown in FIG. 1.

FIG. 5 is a side view showing the transfer robot 23. As shown in FIG. 5, the transfer robot 23 has a hand 231 that holds the wafer W, an inversion mechanism 234 that inverses the hand 231 upside down, an extendable arm 232 that supports the hand W, and a robot body 233 including an arm up-down movement mechanism which moves the arm 232 up and down and an arm revolving mechanism which revolves the arm 232 around a vertical axis line. The robot body 233 is attached to be suspended against a ceiling frame of the polishing portion 14.

In the embodiment, the hand 231 is capable of accessing the slide stage 42 from the carrying-out port 41b of the transfer portion 14 shown in FIG. 3. In addition, the hand 231 is also capable of accessing the first transfer unit 24a and the second transfer unit 24b of the polishing portion 12. Therefore, the wafers W continuously transferred from the transfer portion 14 to the polishing portion 12 are distributed into the first transfer unit 24a and the second transfer unit 24b by the transfer robot 23.

Figure 6:
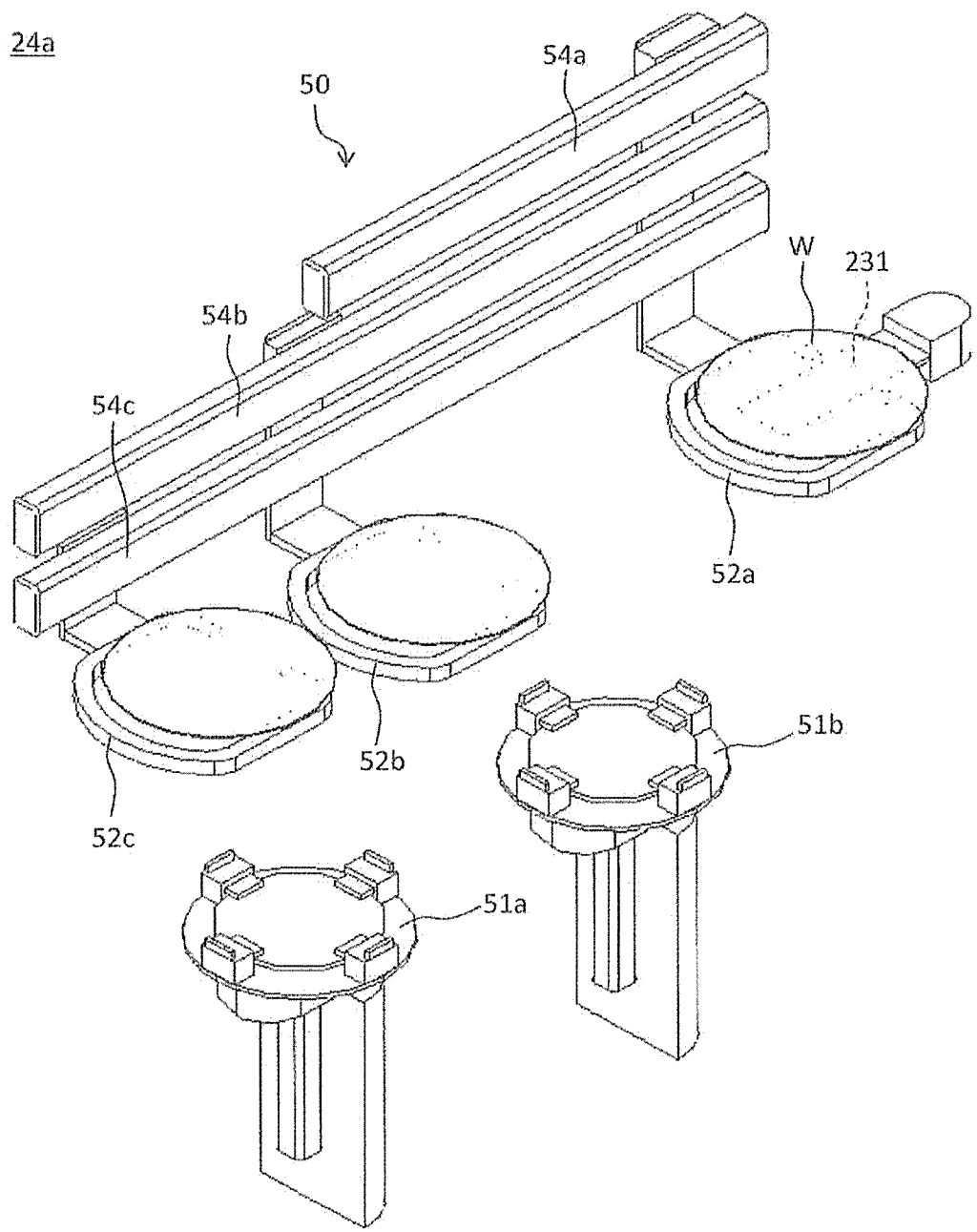
FIG. 6 is a perspective view showing a first transfer mechanism of the substrate processing device shown in FIG. 1.

Because the second transfer unit 24b has the same configuration as the first transfer unit 24a, the first transfer unit 24a is described below. FIG. 6 is a perspective view showing the first transfer unit 24a.

As shown in FIG. 6, the first transfer unit 24a has a first pusher 51a which is arranged at the first substrate transfer position TP1 with respect to the first polishing device 21a and moves up and down, a second pusher 51b which is arranged at the second substrate transfer position TP2 with respect to the second polishing device 21b and moves up and down, and an exchanger 50 which has a first stage 52a, a second stage 52b, and a third stage 52c horizontally moving between the first substrate transfer position TP1 and the second substrate transfer position TP2 independently from each other.

Among these members, the first pusher 51a delivers the wafer W held on any one of the first stage 52a to the third stage 52c to the top ring 25a of the first polishing device 21a, and delivers the wafer W after polishing in the first polishing device 21a to any one of the first stage 52a to the third stage 52c. In addition, the second pusher 51b delivers the wafer W held on any one of the first stage 52a to the third stage 52c to the top ring 25*b* of the second polishing device 21*b*, and delivers the wafer W after polishing in the second polishing device 21*b* to any one of the first stage 52*a* to the third stage 52*c*.

In this way, the first pusher 51*a* and the second pusher 51*b* function as delivery mechanisms for delivering the wafer W between the exchanger 50 and each top ring. Because the second pusher 51*b* has the same structure as the first pusher 51*a*, only the first pusher 51*a* is described in the following description.

Figure 7:
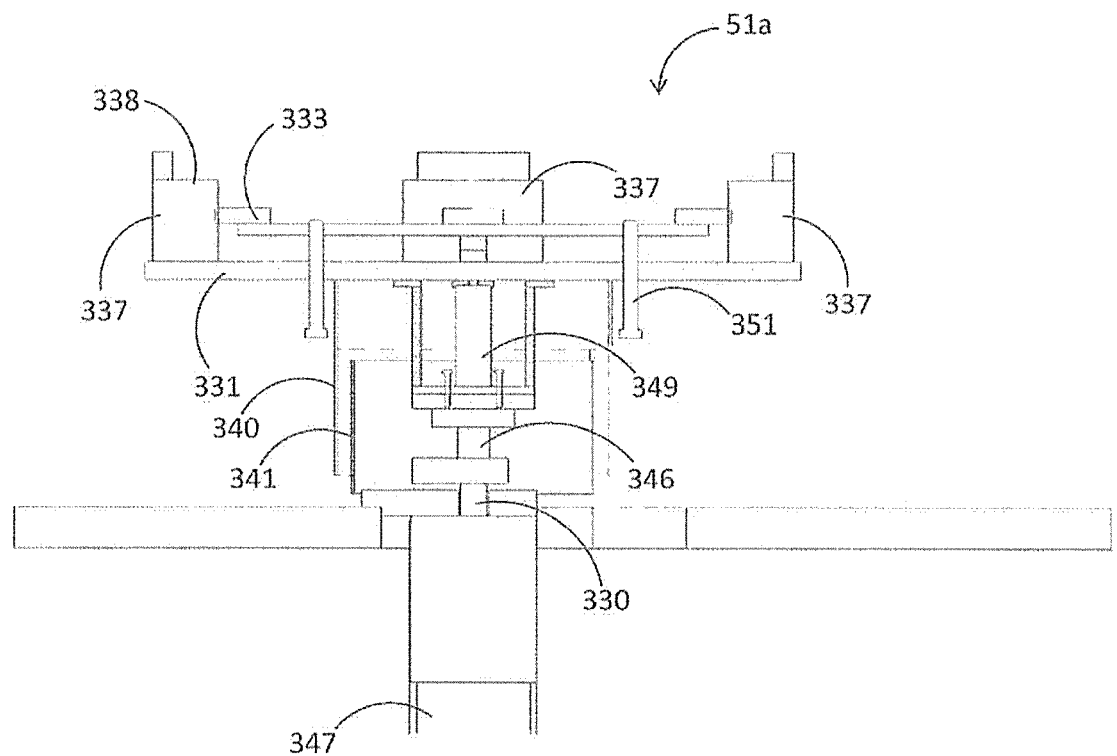
FIG. 7 is a longitudinal cross-sectional view showing a first pusher of the first transfer mechanism show in FIG. 6.

FIG. 7 is a longitudinal cross-sectional view showing the first pusher 51*a*. As shown in FIG. 7, the first pusher 51*a* includes a guide stage 331 for holding the top ring of the first polishing device 21*a*, and a push stage 333 for holding the wafer W. Four top ring guides 337 are set on an outermost periphery of the guide stage 331. An upper stage portion 338 of the top ring guide 337 is an access portion to a lower surface of a guide ring (which is not shown and surrounds the outer periphery of the wafer W) of the top ring. A taper (preferably about 25° to 35°) for introducing the top ring is formed in the upper stage portion 338. When the wafer is loaded or unloaded, the wafer edge is directly received by the top ring guide 337.

A guide sleeve 340 having a waterproof function is set on a back surface of the guide stage 331. A center sleeve 341 for the waterproof of the pusher is set on an inner side of the guide sleeve 340.

In order to provide a positioning mechanism for the top ring guide 337, a linear way 346 which moves in horizontal X-axis and Y-axis directions to perform centering of the guide stage 331 is arranged. The guide stage 331 is fixed to the linear way 346.

The linear way 346 has a structure that enables return to a center position performed by pressurization. By this structure, the centering of the guide stage 331 is realized. Alternatively, the return to the center position can be performed without pressurization by only a spring inside the linear way 346.

In addition, the linear way 346 is fixed to a shaft 330, and the shaft 330 is connected to an electric actuator 347. By the drive of the electric actuator 347, the guide stage 331 moves up and down via the shaft 330. Thereby, when the wafer W is received from the stages 52*a* to 52*c* of the exchanger described later, as a preliminary action, the guide stage 331 can be made to stand by at a height that keeps an optimum clearance for each stage, and thus the time required for the receiving action can be shortened.

The push stage 333 is arranged above the guide stage 331, and a cylinder 349 which moves the push stage 333 up and down with respect to the guide stage 331 is arranged at the center of the push stage 333. The push stage 333 is moved up and down by the cylinder 349 and loads the wafer W onto the top ring. In the embodiment, the push stage 333 is driven by the cylinder 349, and thereby the push stage 333 can be positioned at a position having a desired height. A compression spring 351 for positioning is arranged at an end of the push stage 333.

Additionally, a cleaning nozzle for cleaning dirt is separately set in order to prevent back contamination of the wafer from the slurry and the like adhered to the pusher. A wafer presence/absence sensor for confirming the presence/absence of the wafer on the pusher may also be separately set.

As shown in FIG. 6, the exchanger 52*a* has the first stage 52*a*, the second stage 52*b*, and the third stage 52*c* arranged in multiple upper and lower stages. In the shown example, the first stage 52*a* is arranged in a lower stage, the second stage 52*b* is arranged in a middle stage, and the third stage 52*c* is arranged in an upper stage. Although the first stage 52*a*, the second stage 52*b*, and the third stage 52*c* move on the same axis line passing through the first substrate transfer position TP1 and the second substrate transfer position TP2 in a plan view, because the set heights are different, the first stage 52*a*, the second stage 52*b*, and the third stage 52*c* can move freely without interfering with each other.

As shown in FIG. 6, a first stage drive mechanism 54*a* that linearly moves the first stage 52*a* in a uniaxial direction is arranged at the first stage 52*a*, a second stage drive mechanism 54*b* that linearly moves the second stage 52*b* in the uniaxial direction is arranged at the second stage 52*b*, and a third stage drive mechanism 54*c* which linearly moves the third stage 52*c* in the uniaxial direction is arranged at the third stage 52*c*. For example, an electric actuator or a motor-driven mechanism using a ball screw is used as the first stage drive mechanism 54*a* to the third stage drive mechanism 54*c*. The first stage 52*a* to the third stage 52*c* can move in different directions at different timings by receiving power from the first stage drive mechanism 54*a* to the third stage drive mechanism 54*c* which are respectively different.

Because the second stage 52*b* and the third stage 52*c* have the same configuration as the first stage 52*a*, the first stage 52*a* is described below.

As shown in FIG. 6, the first stage 52*a* has a "U" shape in a plan view in which one side (the right deep side in FIG. 6) of the linear movement direction by the first stage drive mechanism 54*a* is opened. Therefore, when the first stage 52*a* is arranged at the first substrate transfer position TP1, the first pusher 51*a* can move up and down in a manner of passing through an inner side of the first stage 52*a*. In addition, the first stage 52*a* can move to the other side (the left front side in FIG. 6) of the linear movement direction even in a state that the first pusher 51*a* passes through the inner side of the first stage 52*a*.

Although not shown, four pins are arranged to protrude upward at the first stage 52*a*. Therefore, the wafer placed on the first stage 52*a* is supported on the first stage 52*a* in a state that an outer periphery edge of the wafer is guided and positioned by the four pins. These pins are formed from resins such as polypropylene (PP), polychlorotrifluoroethylene (PCTFE), polyetheretherketone (PEEK), and the like.

Next, an example of actions of the first pusher 51*a* and the exchanger 50 configured as described above is described.

First, at the time of wafer loading, the wafer W is transferred to above the first pusher 51*a* by the first stage 52*a* of the exchanger 50. When the top ring 25*a* of the first polishing device 21*a* is at a wafer loading position (the first substrate transfer position TP1) above the first pusher 51*a* and does not hold the wafer W, a set of components around the guide stage 331 is raised by the electric actuator 347. In the middle of rising, the guide stage 331 passes through the inner side of the first stage 52*a*. At this time, the guide stage 331 passes through and centers the wafer W with the taper of the top ring guide 337 at the same time, and holds a pattern surface (other than the edge) of the wafer W by the push stage 333.

The top ring guide 337 is raised without stopping while the push stage 333 holds the wafer W, and the guide ring is attracted by the taper (not shown) of the top ring guide 337. By centering on the top ring by means of the alignment using the linear way 346 which is capable of freely moving in the X and Y directions, and contact of the upper stage portion 338 of the top ring guide 337 with the lower surface of the guide ring, the raising of the guide stage 331 is completed.

The upper stage portion 338 of the top ring guide 337 is in contact with and fixed to the lower surface of the guide ring, and thereby the guide stage 331 is not raised any further. At this time, the push stage 333 is further raised by the cylinder 349. At this time, the push stage 333 holds the pattern surface (other than the edge) of the wafer W, and transfers the wafer W to the top ring. When the top ring completes the adsorption of the wafer W, the first pusher 51a starts to be lowered, and the action is completed at the end of the lowering.

Additionally, in the embodiment, the first stage 52a has a "U" shape in a plan view in which one side (the right deep side in FIG. 6) of the linear movement direction is opened, and thus the first stage 52a can move to the other side (the left front side in FIG. 6) of the linear movement direction even before the first pusher 51a starts to be lowered. Therefore, it is no longer necessary to wait for the lowering of the first pusher 51a when the first stage 52a is moved, and the throughput of the process is improved.

Next, at the time of wafer unloading, the wafer W is transferred to the wafer loading position above the first pusher 51a by the top ring. When the first stage 52a of the exchanger 50 is above the first pusher 51a and no wafer is mounted, the set of components around the guide stage 331 is raised by the electric actuator 347, and the guide ring is attracted by the taper (not shown) of the top ring guide 337. The guide stage 331 is centered on the top ring by the alignment using the linear way 346, the upper stage portion 338 of the top ring guide 337 comes into contact with the lower surface of the guide ring, and thereby the raising of the guide stage 331 is completed.

Then, the wafer W is released from the top ring. At this time, the wafer W is centered by a lower stage taper of the top ring guide 337, and the edge part is held by the top ring guide 337. When the wafer W is held by the first pusher 51a, the first pusher 51a starts to be lowered. During the lowering, the guide stage 331 which moves the center position for the top ring centering is centered by the guide sleeve 340 and the center sleeve 341. In the middle of the lowering, the delivery is performed from the first pusher 51a to the first stage 52a at the edge part of the wafer W, and the action is completed at the end of the lowering.

<Cleaning Portion>

As shown in FIG. 1 and FIG. 2, the cleaning portion 13 is a region in which the wafer after polishing is cleaned, and has a first cleaning unit 30a and a second cleaning unit 30b arranged in upper and lower stages. The transfer portion 14 described above is arranged between the first cleaning unit 30a and the second cleaning unit 30b. Because the first cleaning unit 30a, the transfer portion 14, and the second cleaning unit 30b are arranged to overlap each other in an up-down direction, an advantage that a footprint is small can be obtained.

As shown in FIG. 1 and FIG. 2, the first cleaning unit 30a has a plurality of (four in the shown example) cleaning modules 311a, 312a, 313a, and 314a, a wafer station 33a, and a cleaning portion transfer mechanism 32a which transfers the wafer W between each of the cleaning modules 311a to 314a and the wafer station 33a. The plurality of cleaning modules 311a to 314a and the wafer station 33a are arranged in series along the longitudinal direction of the substrate processing device 10. A filter fan unit (not shown) having a clean air filter is arranged at the upper part of each of the cleaning modules 311a to 314a, and clean air from which particles are removed by the filter fan unit is constantly blown downward. In addition, an interior of the first cleaning unit 30a is constantly maintained at a pressure higher than that of the polishing portion 12 in order to prevent the inflow of particles from the polishing portion 12.

Similarly, the second cleaning unit 30b has a plurality of (four in the shown example) cleaning modules 311b, 312b, 313b, and 314b, a wafer station 33b, and a cleaning portion transfer mechanism 32b which transfers the wafer W between each of the cleaning modules 311b to 314b and the wafer station 33b. The plurality of cleaning modules 311b to 314b and the wafer station 33b are arranged in series along the longitudinal direction of the substrate processing device 10. A filter fan unit (not shown) having a clean air filter is arranged at the upper part of each of the cleaning modules 311b to 314b, and clean air from which particles are removed by the filter fan unit is constantly blown downward. In addition, an interior of the second cleaning unit 30b is constantly maintained at a pressure higher than that of the polishing portion 12 in order to prevent the inflow of particles from the polishing portion 12.

<Polish Processing Using Substrate Processing Device>

Next, an example of processing for polishing the wafer W by using the substrate processing device 10 having this configuration is described. Additionally, the polishing processing described below is performed by the control portion 15 controlling the actions of the loading/unloading portion 11, the polishing portion 12, the cleaning portion 13, and the transfer portion 14. In addition, the control portion 15 has a timetable in which a processing end time point or a scheduled processing end time point in the loading/unloading portion 11, the transfer portion 14, the polishing portion 12, and the cleaning portion 13 is associated with each substrate W, and controls a timing of removing the substrate W from a cassette 113 based on the timetable. Here, the timetable is created by the control portion 15 (or an information processing device separate from the control portion 15) executing "a method for determining a timing of removing a substrate from a cassette" described later.

Figure 8A:
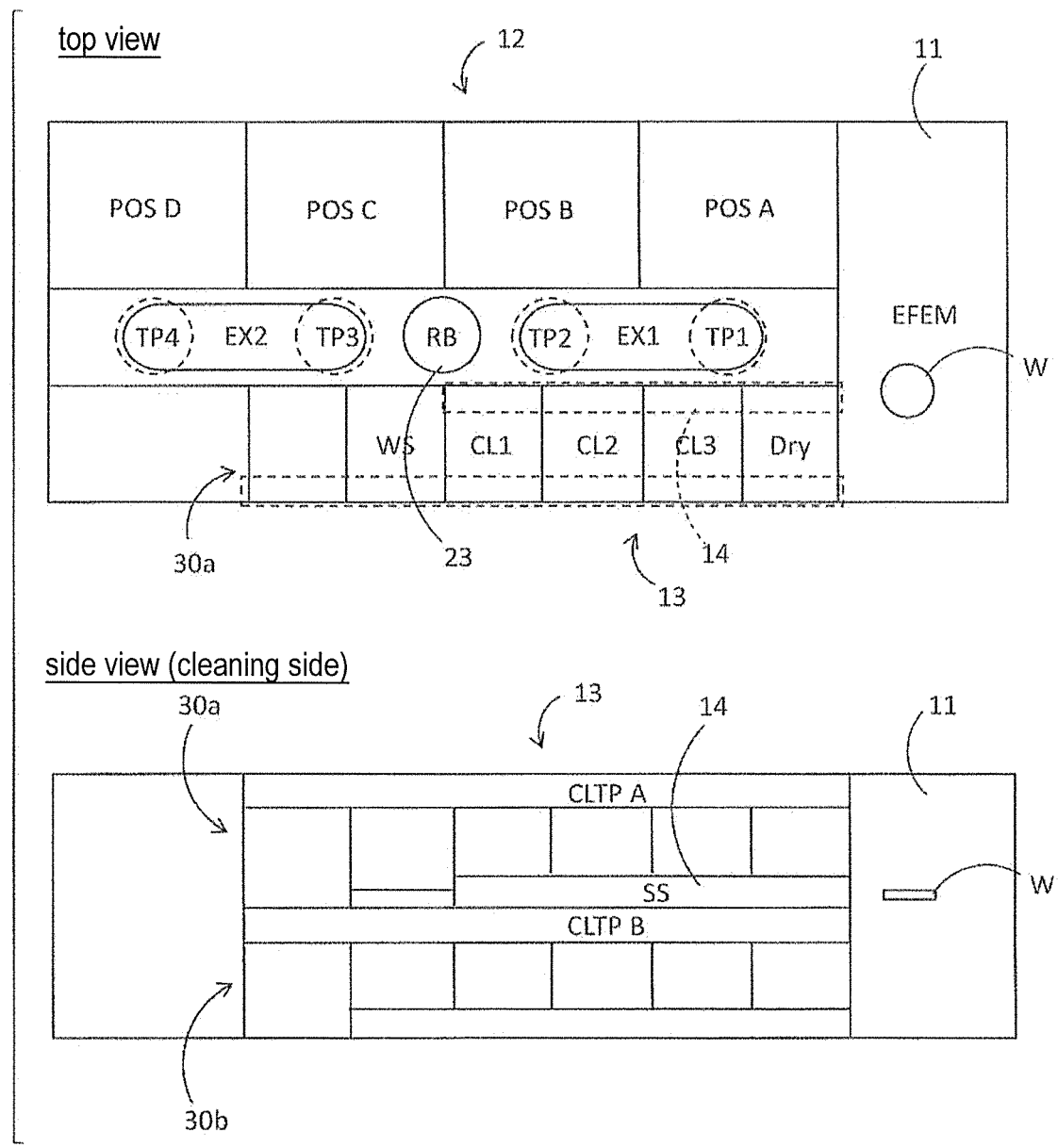
FIG. 8A is a schematic diagram for describing an action of the transfer portion.
Figure 8B:
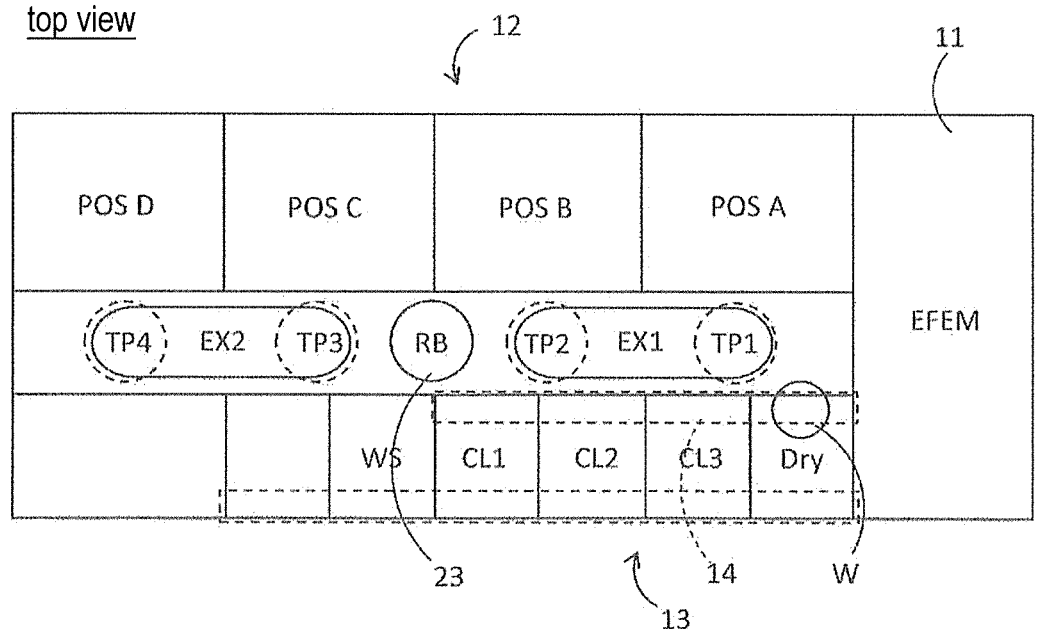
FIG. 8B is a schematic diagram for describing an action of the transfer portion.
Figure 8B:
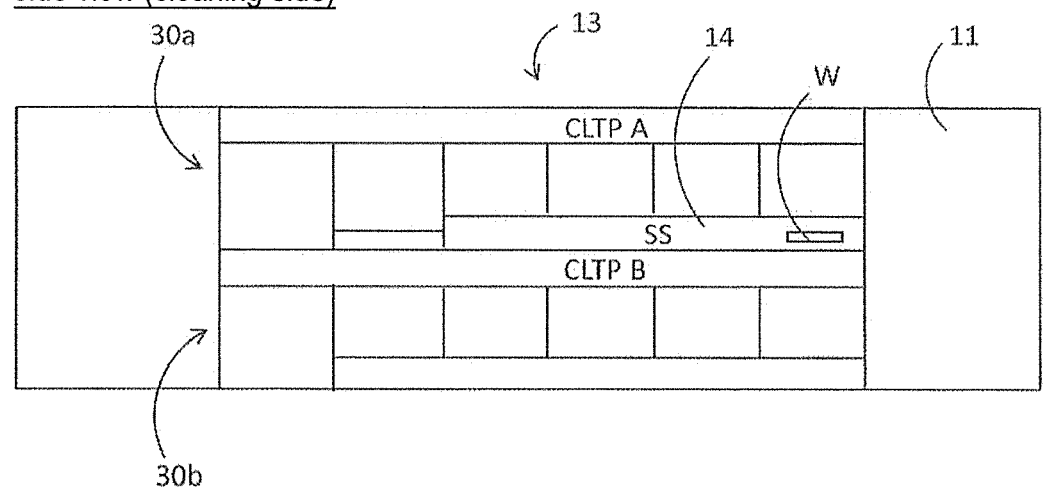

First, as shown in FIG. 8A and FIG. 1, the wafer W before polishing is removed from a wafer cassette of the front loading portion 113 by the transfer robot 111 of the loading/unloading portion 11, and is moved to a position facing the carrying-in port 41a of the transfer portion 14. Then, as shown in FIG. 8B and FIG. 3, after the carrying-in port 41a of the transfer portion 14 is opened, the wafer W held by the transfer robot 111 is inserted into the inner side of the cover 41 from the carrying-in port 41a, and is placed and supported on the slide stage 42.

Figure 8C:
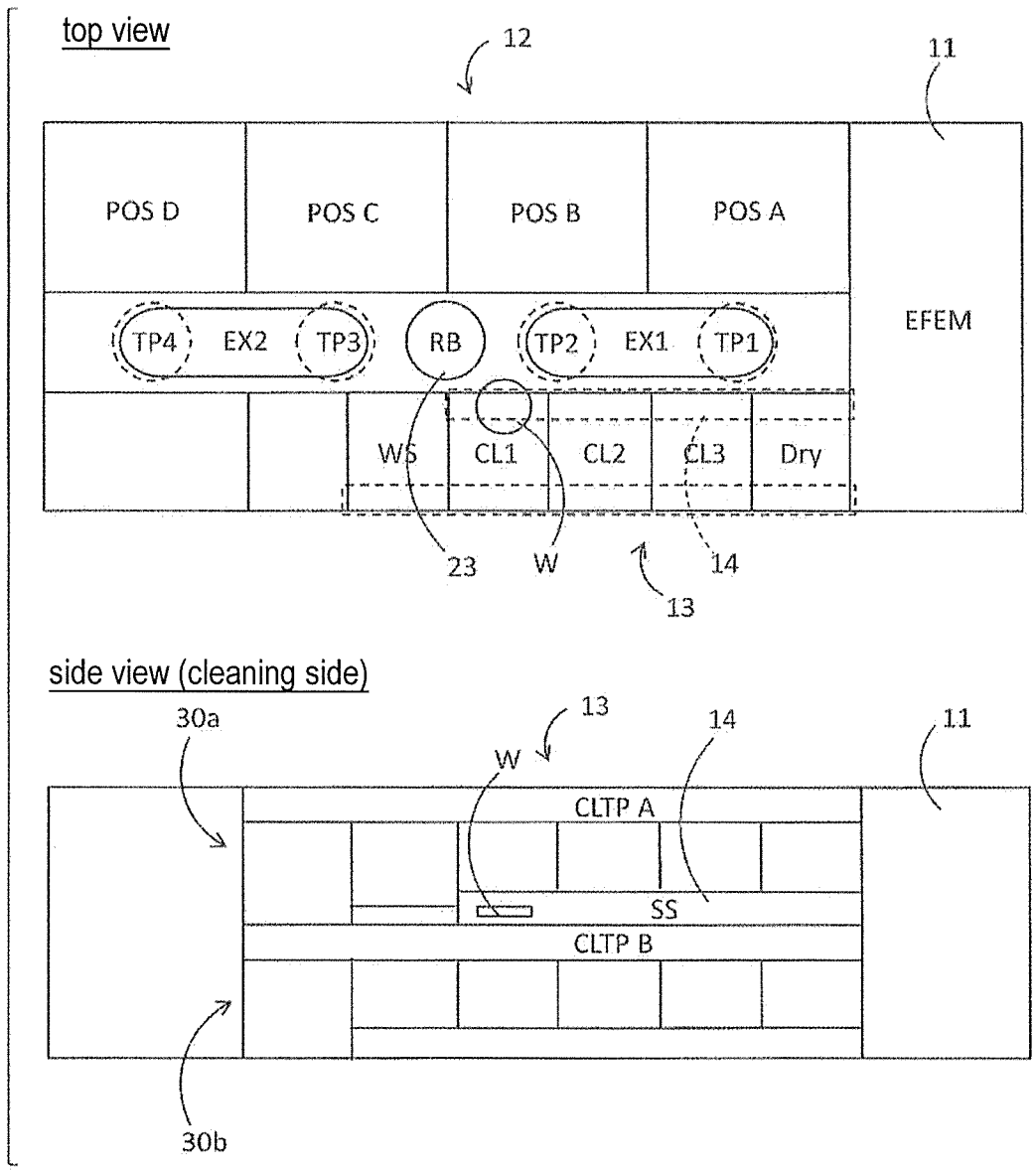
FIG. 8C is a schematic diagram for describing an action of the transfer portion.

Next, as shown in FIG. 8C and FIG. 3, the slide stage 42 holding the wafer W is moved along the longitudinal direction to a position facing the carrying-out port 41b by the power given from the stage movement mechanism 43. Then, the carrying-out port 41b of the transfer portion 14 is opened. At this time, a flow of air flowing from the carrying-in port 41a side to the carrying-out port 41b side is formed on the inner side of the cover 41 of the transfer portion 14 by the exhaust duct 44. Thereby, the particles in the polishing portion 12 are prevented from diffusing into the loading/unloading portion 11 through the transfer portion 14.

Figure 9A:
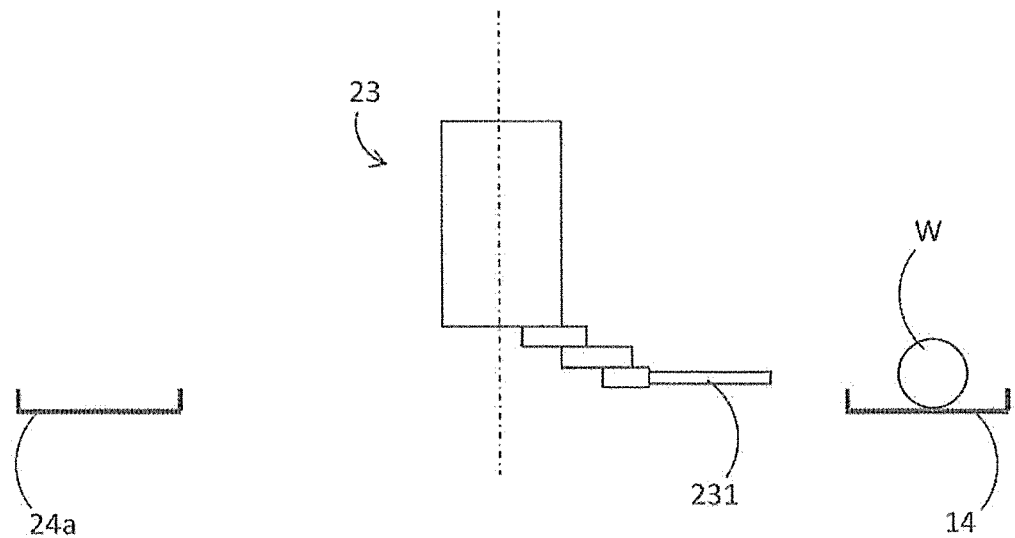
FIG. 9A is a schematic diagram for describing an action of the transfer robot.
Figure 9B:
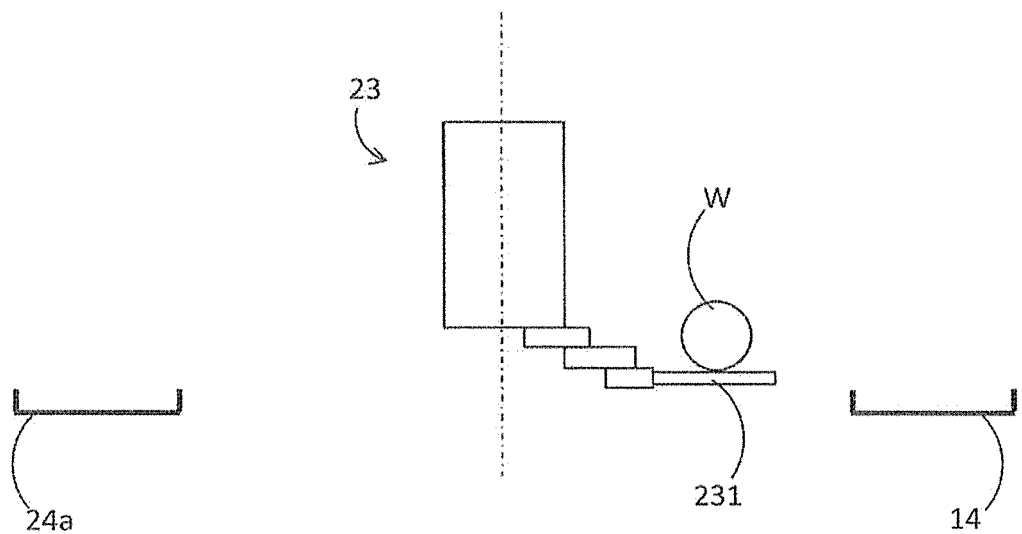
FIG. 9B is a schematic diagram for describing an action of the transfer robot.
Figure 9C:
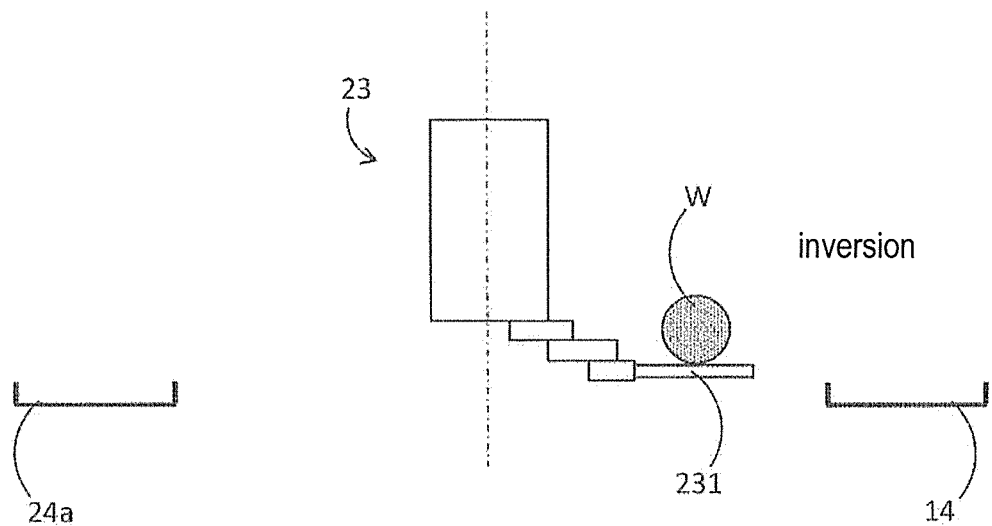
FIG. 9C is a schematic diagram for describing an action of the transfer robot.

As shown in FIG. 9A and FIG. 3, in a state that the hand 231 of the transfer robot 23 of the polishing portion 12 is positioned at the same height as the carrying-out port 41b of the transfer portion 14, the arm 232 of the transfer robot 23 is extended. The hand 231 supported by a front end of the arm is inserted into the inner side of the cover 41 through the carrying-out port 41b, and is put to the lower part of the wafer W held on the slide stage 42. Subsequently, the hand 231 is raised, and the wafer W is delivered from the slide stage 42 to the hand 231. Then, as shown in FIG. 9B, the arm 232 is contracted, and thereby the wafer W held on the hand 231 is removed from the transfer portion 14 to the polishing portion 12. After that, as shown in FIG. 9C, the hand 231 is inversed upside down together with the wafer W by the inversion mechanism 234 of the transfer robot 23. Note that, in the drawings, the gray-painted wafer W indicates the wafer inversed upside down.

Figure 9D:
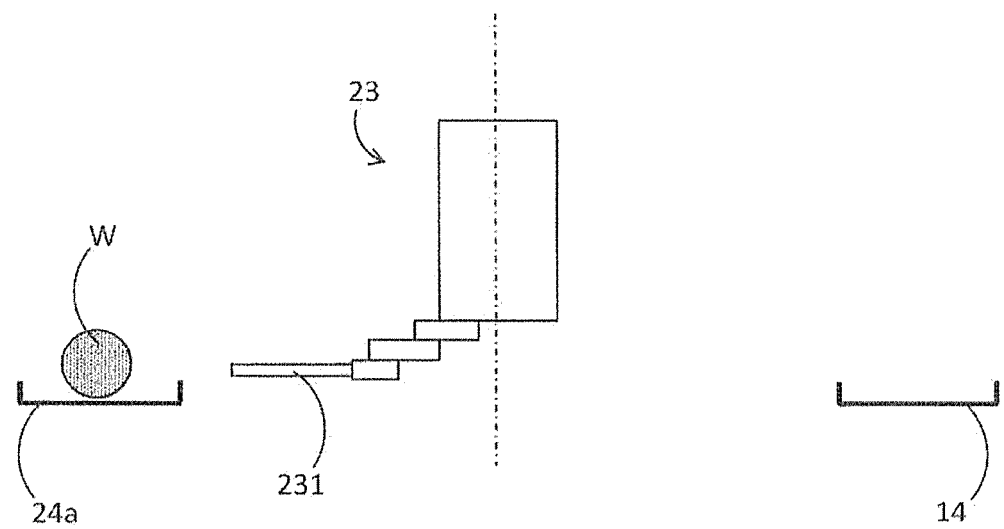
FIG. 9D is a schematic diagram for describing an action of the transfer robot.

Next, as shown in FIG. 9D, the arm 232 is revolved around an axis line of the robot body 233, and the hand 231 is directed toward the first transfer unit 24a side. Then, the arm 232 is extended, and the wafer W held by the hand 231 is delivered to the first transfer unit 24a and is transferred from the first transfer unit 24a to the first polishing device 21a or the second polishing device 21b. Additionally, in a case in which the first polishing unit 20a is congested or in other cases, the wafer W held by the hand 231 may be delivered to the second transfer unit 24b and transferred from the second transfer unit 24b to the third polishing device 21c or the fourth polishing device 21d. In the embodiment, the wafers W transferred from the transfer portion 14 to the polishing portion 12 are distributed into the first transfer unit 24a and the second transfer unit 24b by the transfer robot 23, the wafer W is carried into the first polishing device 21a or the second polishing device 21b from the first transfer unit 24a, and the wafer W is carried into the third polishing device 21c or the fourth polishing device 21d from the second transfer unit 24b. Therefore, the first polishing unit 20a and the second polishing unit 20b do not share the carrying-in route, and the congestion when the substrates are carried into the first polishing unit 20a and the second polishing unit 20b is eliminated. Therefore, the throughput of the entire process is improved.

Because the wafer delivery action by the second transfer unit 24b is the same as the wafer delivery action by the first transfer unit 24a, the wafer delivery action by the first transfer unit 24a is described below.

Figure 10A:
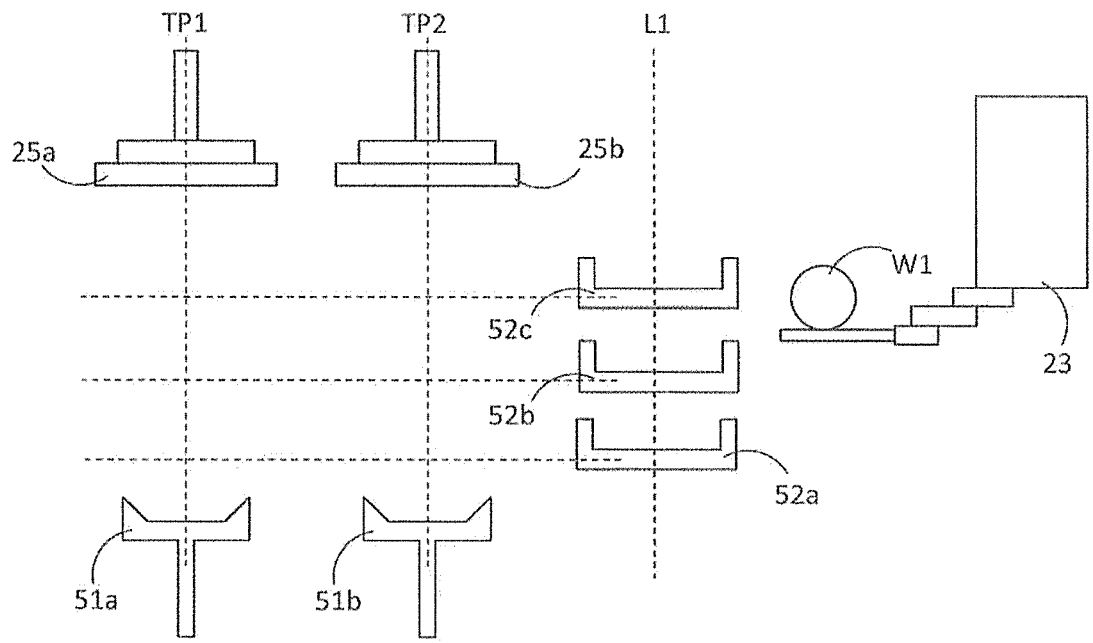
FIG. 10A is a schematic diagram for describing an action of the first transfer mechanism.
Figure 10B:
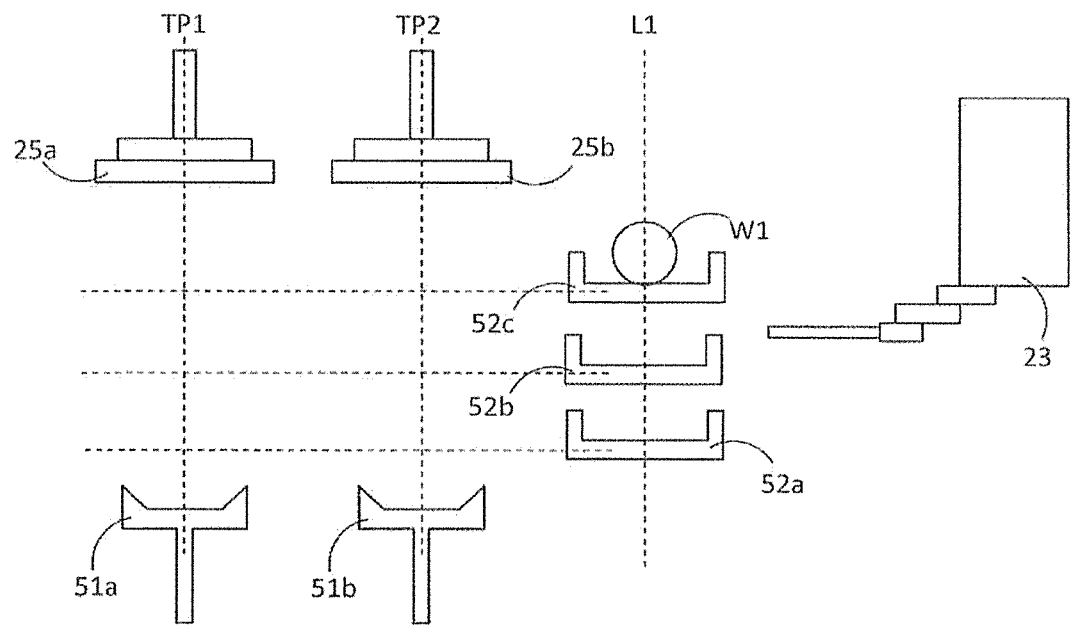
FIG. 10B is a schematic diagram for describing an action of the first transfer mechanism.
Figure 10C:
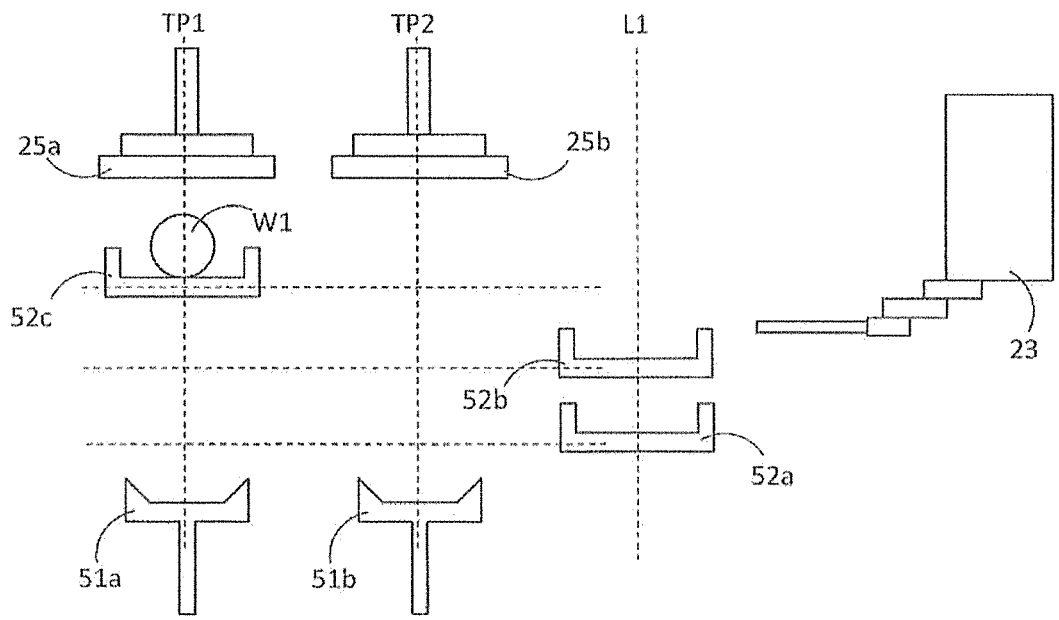
FIG. 10C is a schematic diagram for describing an action of the first transfer mechanism.

When two wafers are processed concurrently (parallelly) by the first polishing device 21a and the second polishing device 21b, as shown in FIG. 10A and FIG. 10B, a first wafer W1 before polishing held by the transfer robot 23 is delivered to the third stage 52c of the exchanger 50 arranged at a standby position L1. Then, as shown in FIG. 10C, the third stage 52c holding the first wafer W1 is moved from the standby position L1 to the first substrate transfer position TP1.

Figure 10D:
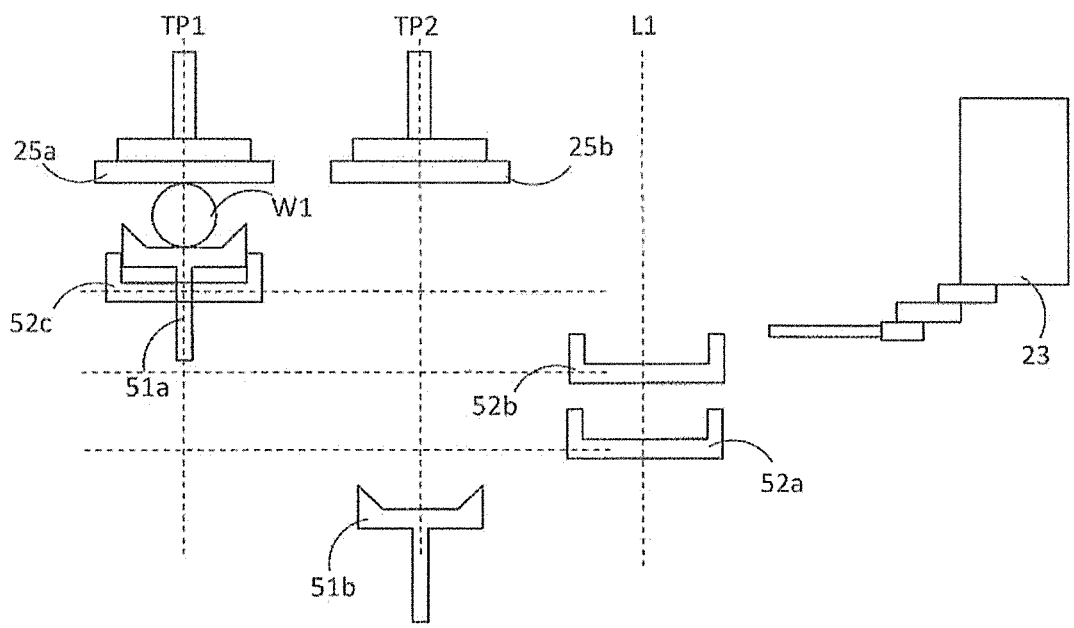
FIG. 10D is a schematic diagram for describing an action of the first transfer mechanism.
Figure 10E:
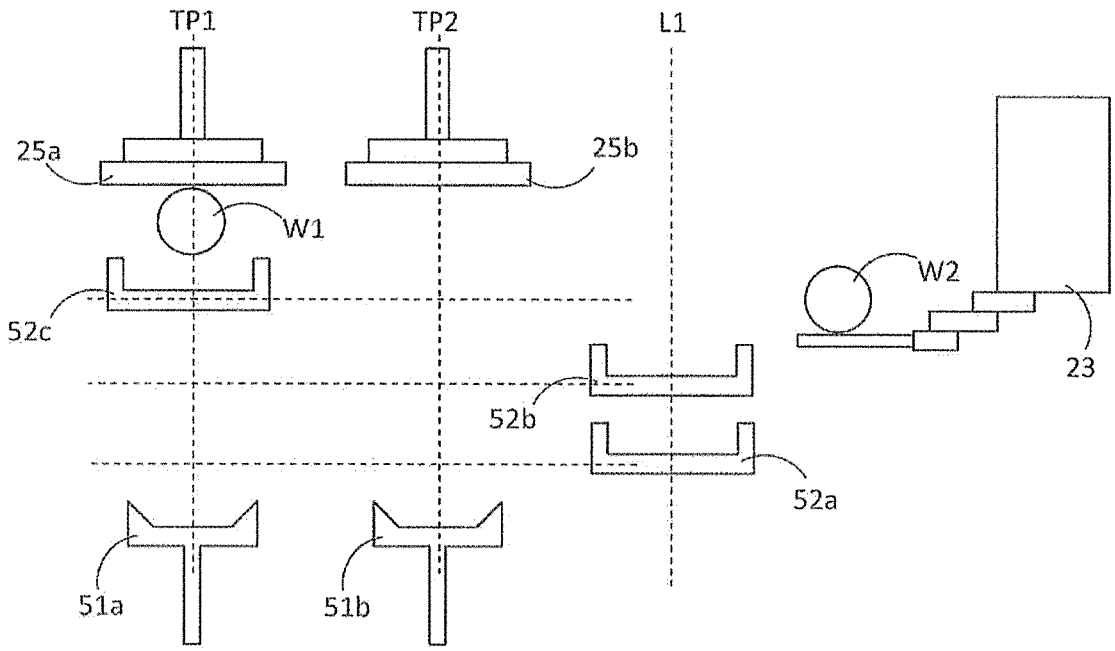
FIG. 10E is a schematic diagram for describing an action of the first transfer mechanism.

Next, as shown in FIG. 10D, the first pusher 51a is raised and passes through an inner side of the third stage 52c, and the first wafer W1 on the third stage 52c is pushed up by the first pusher 51a and delivered to the top ring 25a of the first polishing device 21a. Then, after the first wafer W1 is adsorbed to the top ring 25a of the first polishing device 21a and held by the top ring 25a, as shown in FIG. 10E, the first pusher 51a is lowered to the initial height position. The transfer robot 23 holds a second wafer W2 before polishing.

Figure 10F:
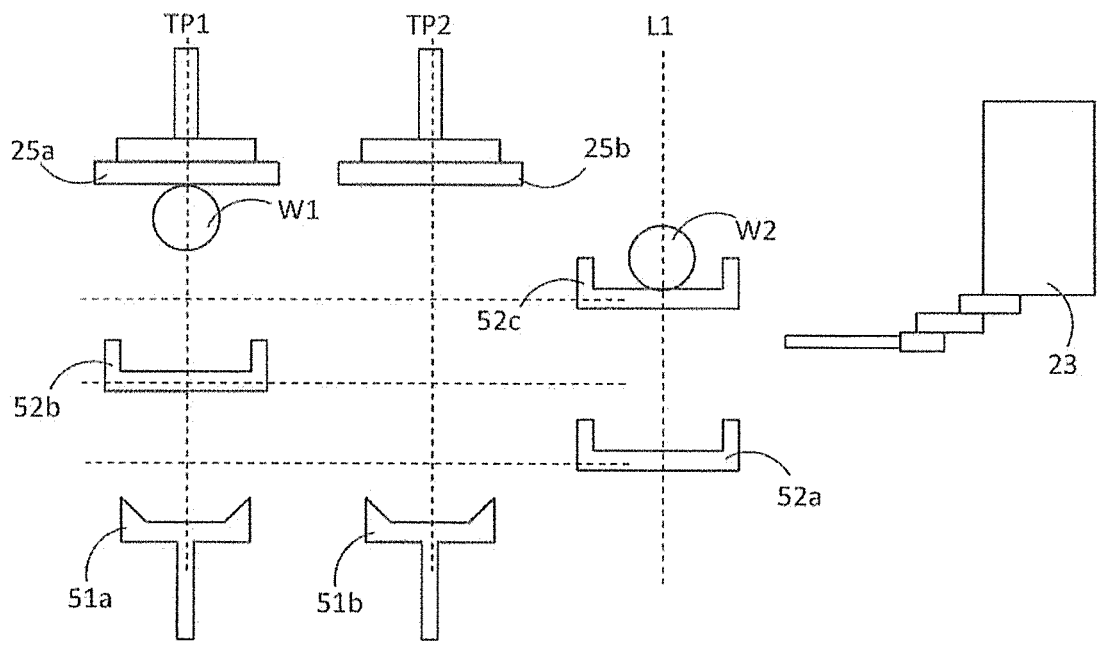
FIG. 10F is a schematic diagram for describing an action of the first transfer mechanism.
Figure 10G:
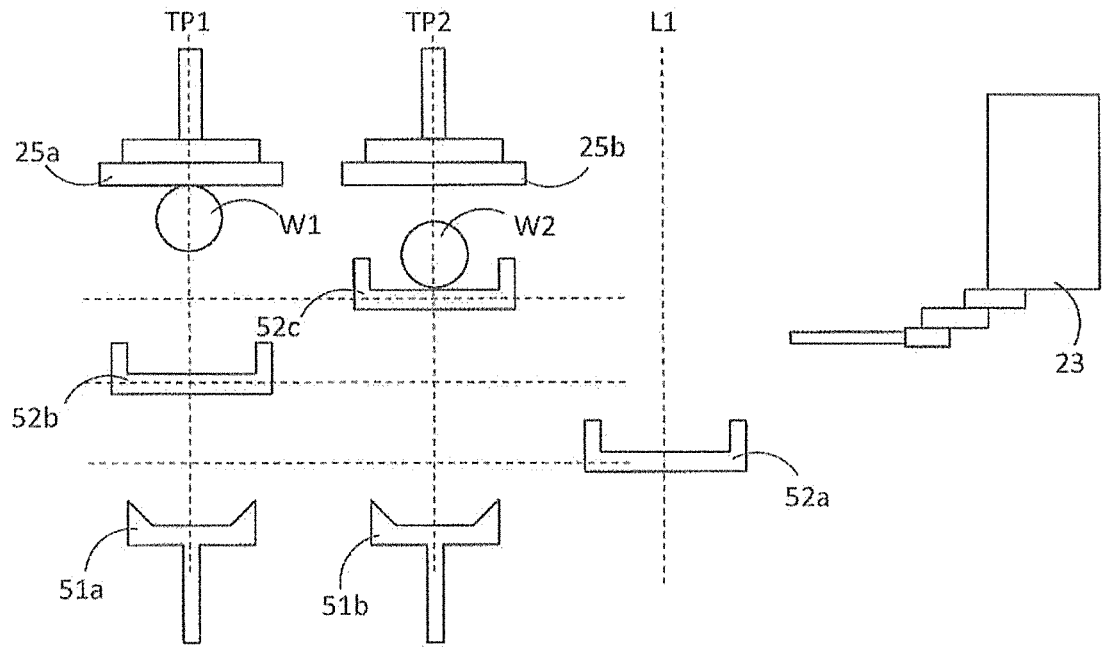
FIG. 10G is a schematic diagram for describing an action of the first transfer mechanism.

After that, as shown in FIG. 10F, the polishing of the first wafer W1 is performed by the first polishing device 21a. At this time, the third stage 52c is moved from the first substrate transfer position TP1 to the standby position L1, and the second stage 52b is moved from the standby position L1 to the first substrate transfer position TP1. The second wafer W2 before polishing held by the transfer robot 23 is delivered to the third stage 52c arranged at the standby position L1. Then, as shown in FIG. 10G, the third stage 52c holding the second wafer W2 is moved from the standby position L1 to the second substrate transfer position TP2.

Figure 12:
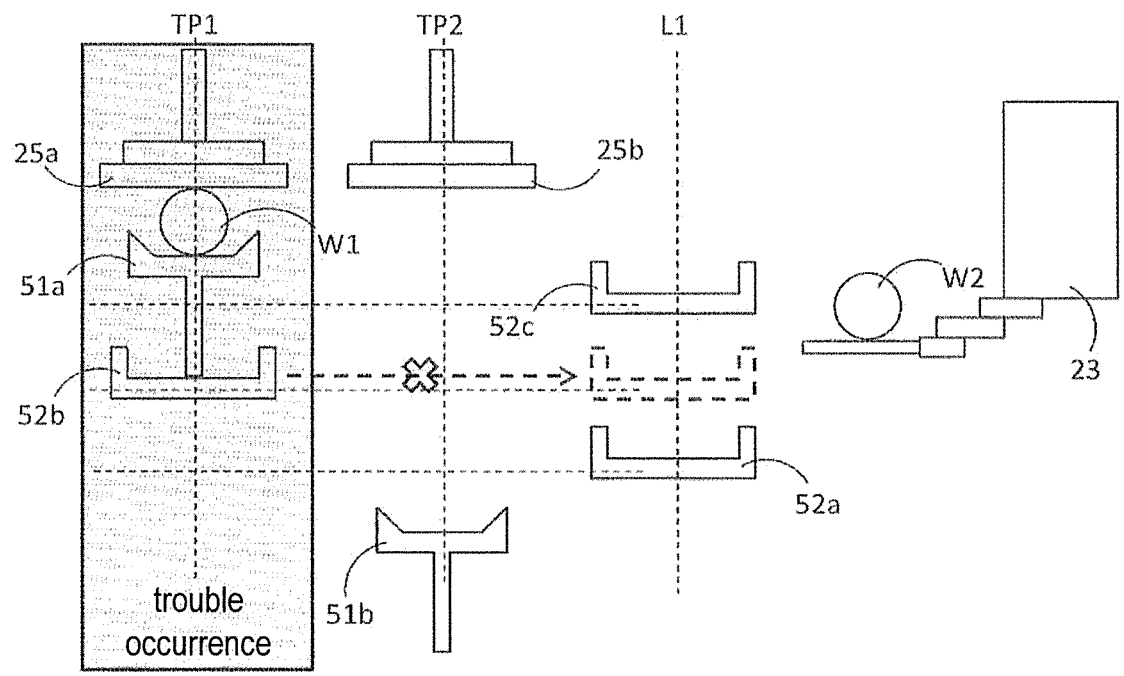
FIG. 12 is a schematic diagram for describing an occurrence of deadlock in parallel processing.

Meanwhile, even when the parallel processing is performed by the first polishing device 21a and the second polishing device 21b, as in the case in which the series processing is performed by the first polishing device 21a and the second polishing device 21b, it is also possible to use the second stage 52b to receive the wafer from the first polishing device 21a and use the same second stage 52b to deliver the wafer to the second polishing device 21b. However, in this case, as shown in FIG. 12, if a trouble occurs when the wafer is received from the first polishing device 21a and the second stage 52b cannot be used, the wafer delivery to the second polishing device 21b cannot be performed due to this situation (deadlock occurs).

On the other hand, in the embodiment, when the wafers are polished concurrently by the first polishing device 21a and the second polishing device 21b, the wafer delivery to both the first polishing device 21a and the second polishing device 21b is performed using the same third stage 52c, and the second stage 52b and the first stage 52a are dedicated to receiving the wafers from the first polishing device 21a and the second polishing device 21b respectively, and thus even if a trouble occurs when the wafer is received from the first polishing device 21a and the second stage 52b cannot be used, the wafer delivery to the second polishing device 21b can be continuously performed (the deadlock does not occur).

Figure 10H:
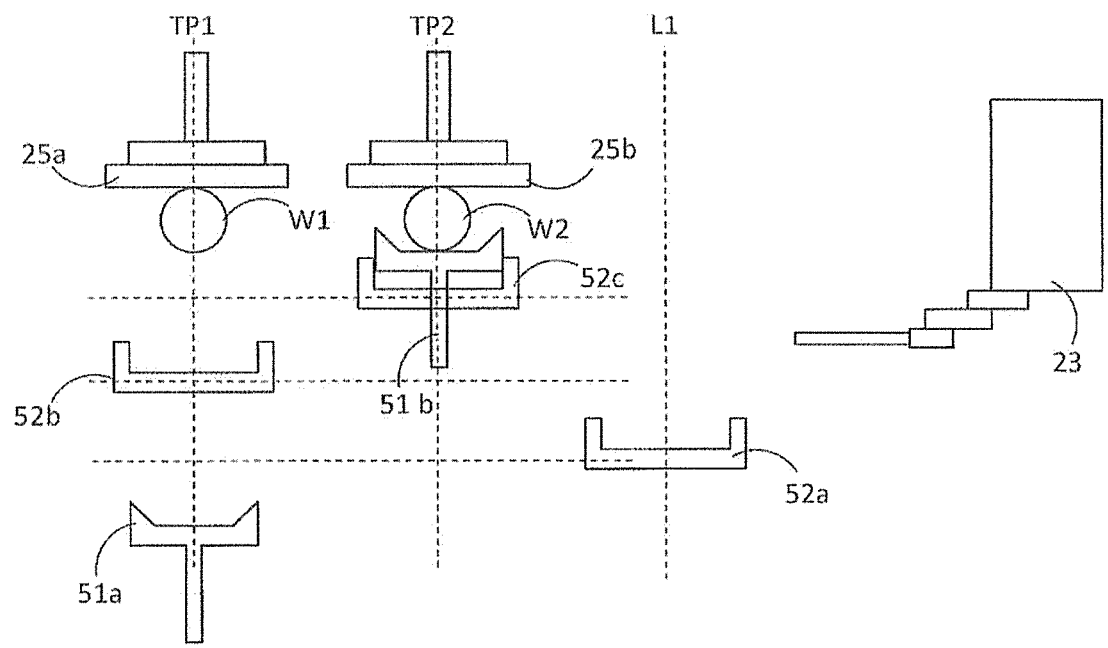
FIG. 10H is a schematic diagram for describing an action of the first transfer mechanism.
Figure 10I:
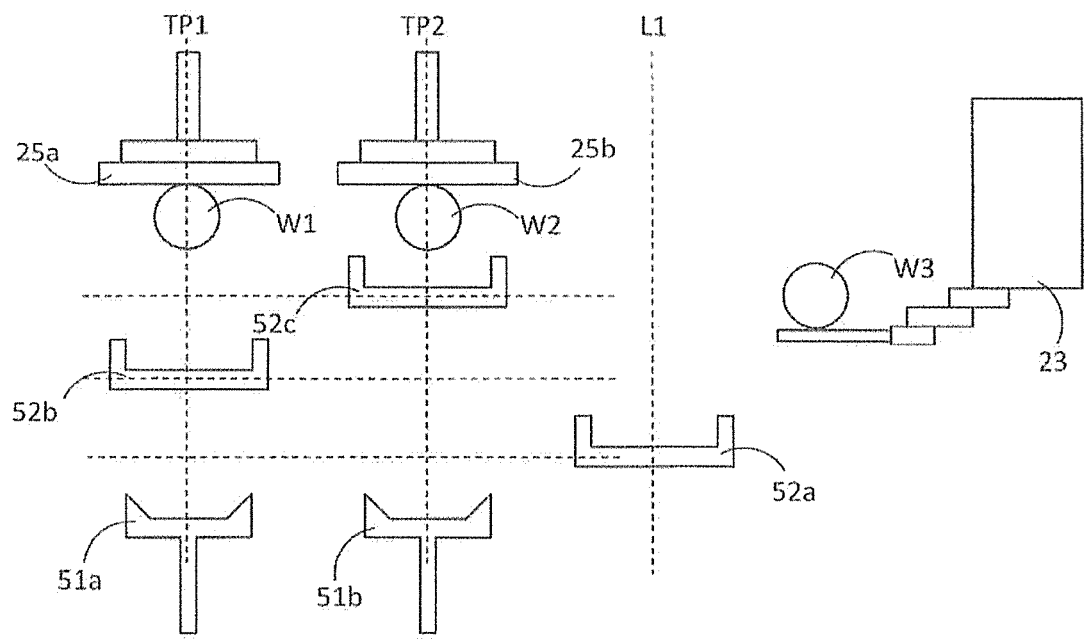
FIG. 10I is a schematic diagram for describing an action of the first transfer mechanism.

Next, as shown in FIG. 10H, the second pusher 51b is raised and passes through the inner side of the third stage 52c, and the second wafer W2 on the third stage 52c is pushed up by the second pusher 51b and delivered to the top ring 25b of the second polishing device 21b. Then, after the second wafer W2 is adsorbed to the top ring 25b of the second polishing device 21b and held by the top ring 25b, as shown in FIG. 10I, the second pusher 51b is lowered to the initial height position. The transfer robot 23 holds a third wafer W3 before polishing.

Figure 10J:
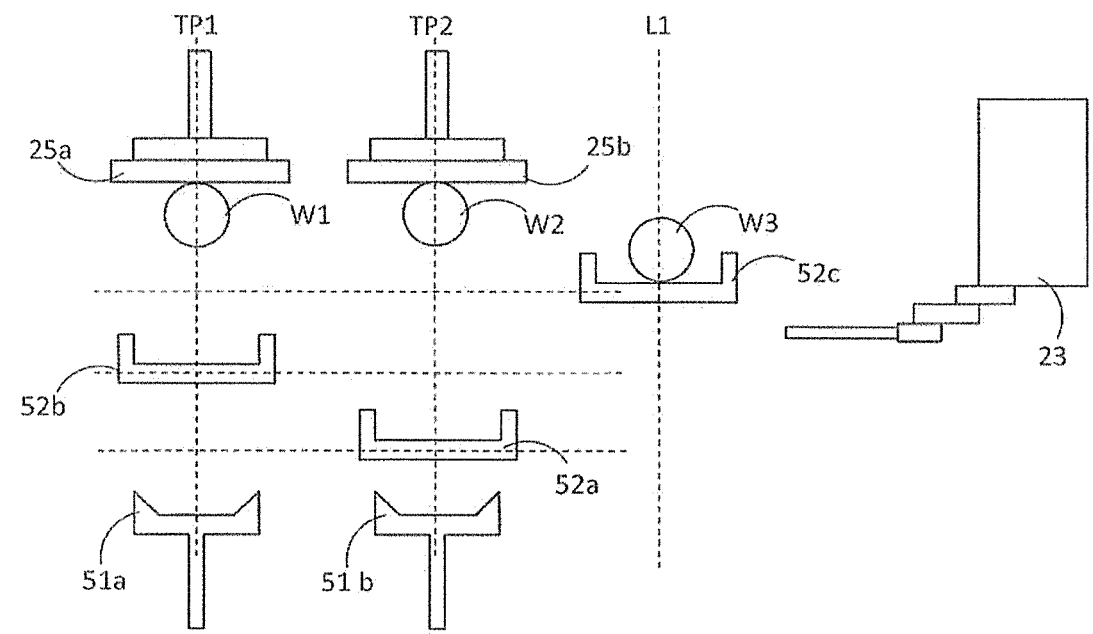
FIG. 10J is a schematic diagram for describing an action of the first transfer mechanism.

After that, as shown in FIG. 10J, the polishing of the second wafer W2 is performed by the second polishing device 21b. At this time, the third stage 52c is moved from the second substrate transfer position TP2 to the standby position L1, and the first stage 52a is moved from the standby position L1 to the second substrate transfer position TP2. The third wafer W3 before polishing held by the transfer robot 23 is delivered to the third stage 52c arranged at the standby position L1.

Figure 10K:
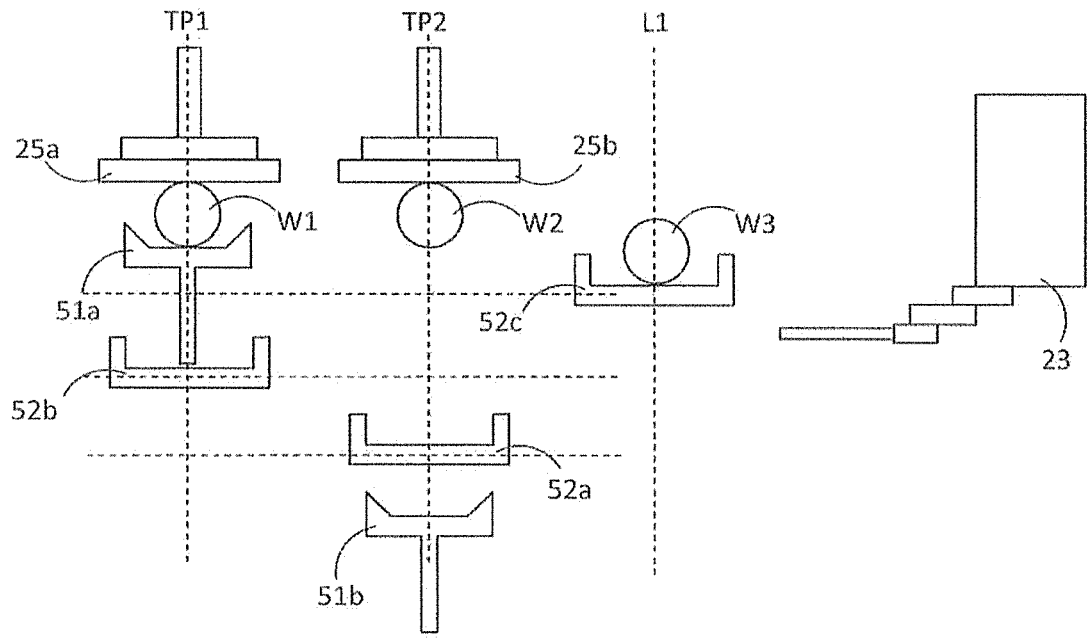
FIG. 10K is a schematic diagram for describing an action of the first transfer mechanism.
Figure 10L:
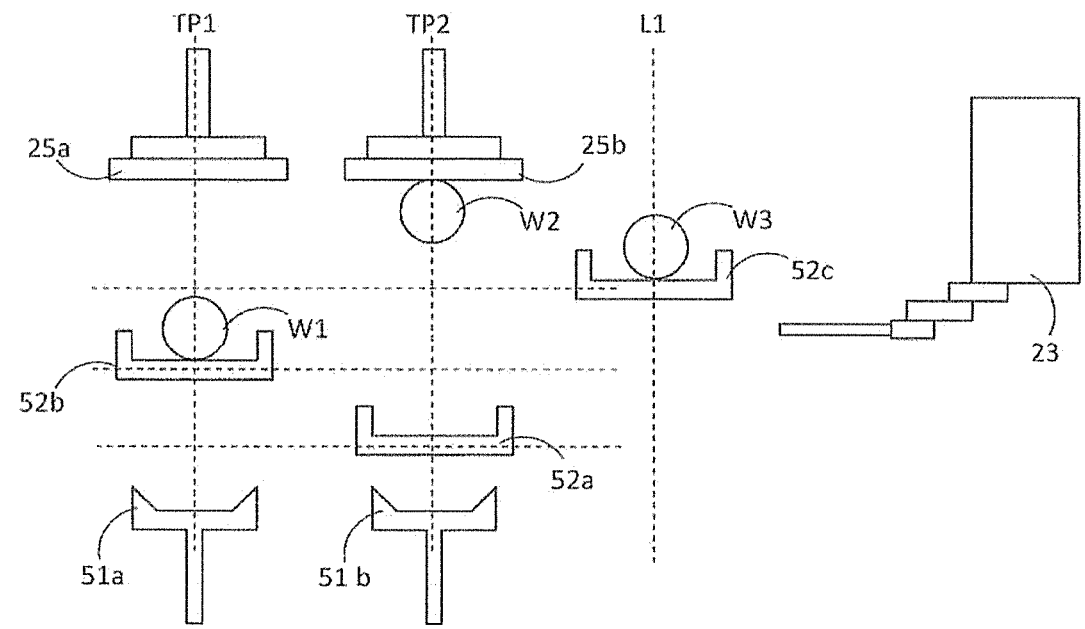
FIG. 10L is a schematic diagram for describing an action of the first transfer mechanism.

If the polishing performed by the first polishing device 21a is completed before the polishing performed by the second polishing device 21b is completed, as shown in FIG. 10K, the first pusher 51a is raised and receives the first wafer W1 that has been polished from the top ring 25a of the first polishing device 21a. Then, as shown in FIG. 10L, the first pusher 51a is lowered and passes through the second stage 52b, and the first wafer W1 on the first pusher 51a is delivered to the second stage 52b. The first wafer W1 held by the second stage 52b is cleaned by a cleaning nozzle (not shown) at the first substrate transfer position TP1.

Figure 10M:
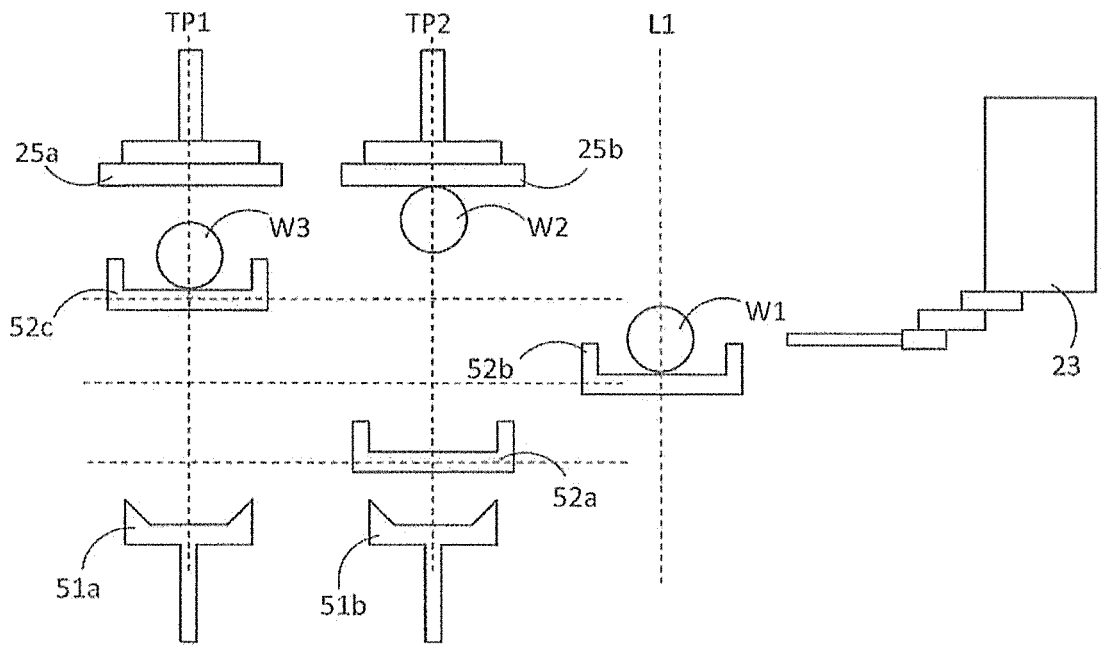
FIG. 10M is a schematic diagram for describing an action of the first transfer mechanism.

Next, as shown in FIG. 10M, the second stage 52b holding the first wafer W1 is moved from the first substrate transfer position TP1 to the standby position L1, and at the same time, the third stage 52c holding the third wafer W3 is moved from the standby position L1 to the first substrate transfer position TP1. The first wafer W1 held by the second stage 52b is removed from above the second stage 52b by the transfer robot 23 at the standby position L1.

Figure 10N:
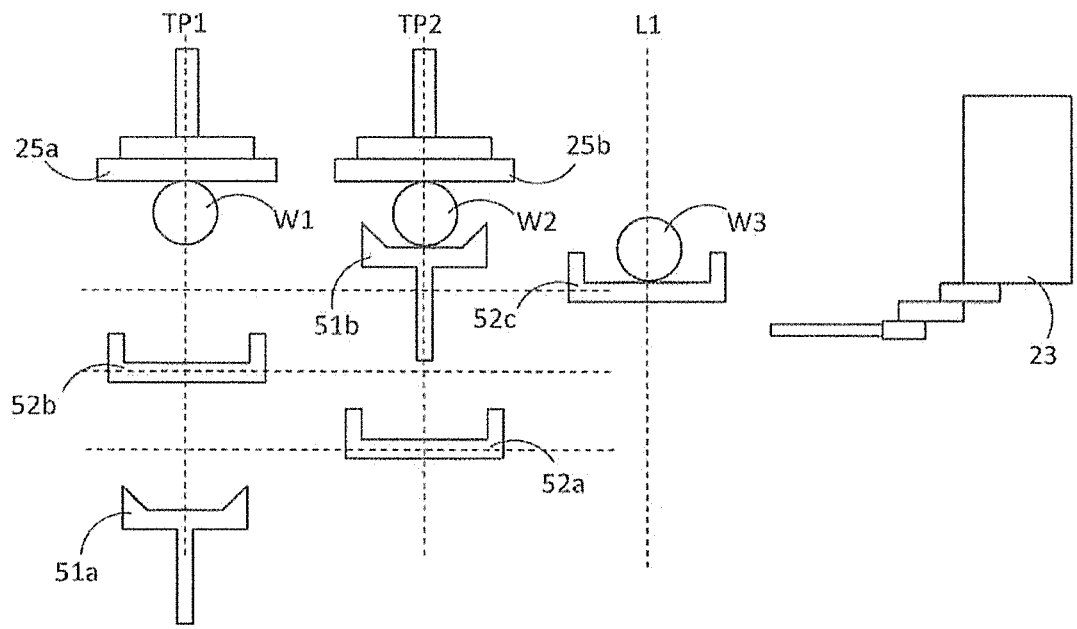
FIG. 10N is a schematic diagram for describing an action of the first transfer mechanism.
Figure 10O:
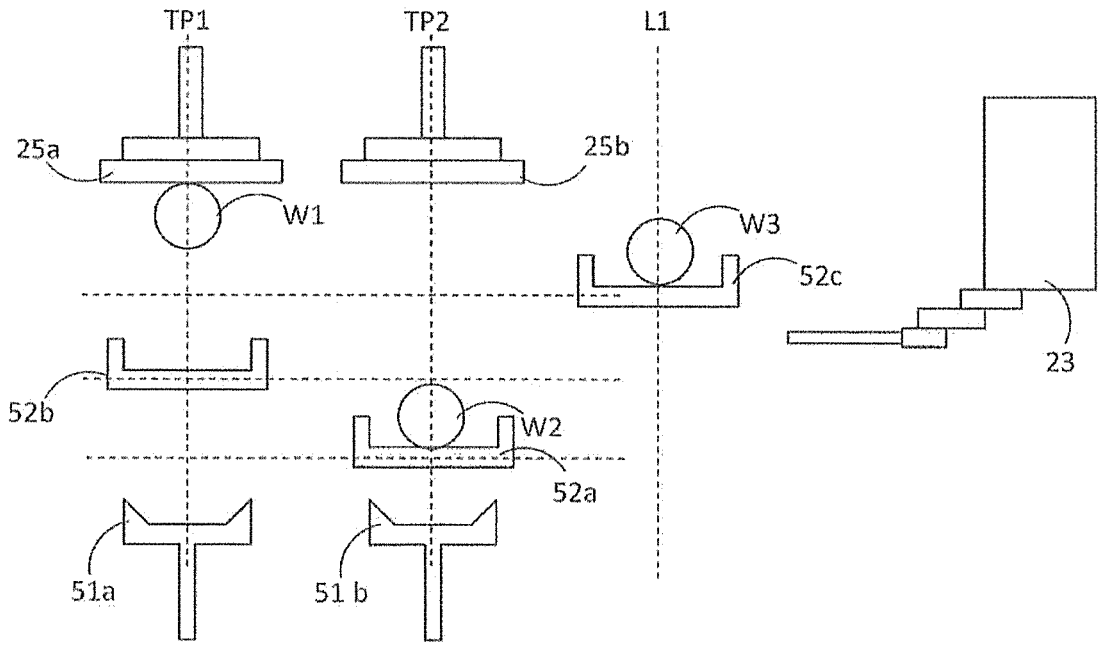
FIG. 10O is a schematic diagram for describing an action of the first transfer mechanism.

On the other hand, when the polishing at the second polishing device 21b is completed before the polishing at the first polishing device 21a is completed, as shown in FIG. 10N, the second pusher 51b is raised and receives the polished second wafer W2 from the top ring 25b of the second polishing device 21b. Then, as shown in FIG. 10O, the second pusher 51b is lowered and passes through the first stage 52a, and the second wafer W2 on the second pusher 51b is delivered to the first stage 52a. The second wafer W2 held by the first stage 52a is cleaned by a cleaning nozzle (not shown) at the second substrate transfer position TP2.

Figure 10P:
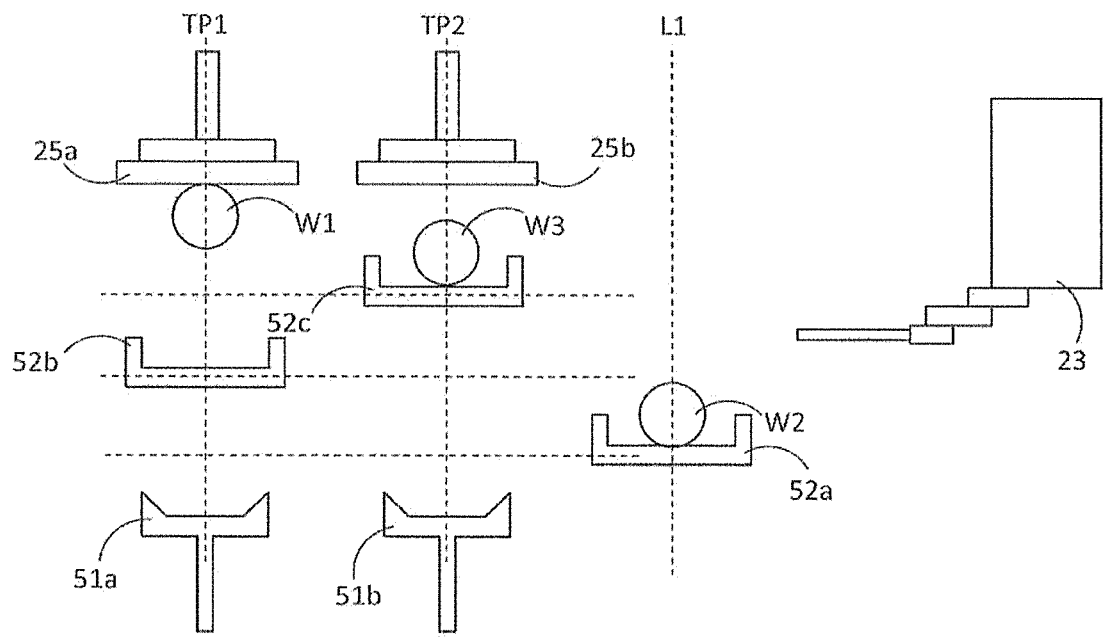
FIG. 10P is a schematic diagram for describing an action of the first transfer mechanism.

Next, as shown in FIG. 10P, the first stage 52a holding the second wafer W2 is moved from the second substrate transfer position TP2 to the standby position L1, and at the same time, the third stage 52c holding the third wafer W3 is moved from the standby position L1 to the second substrate transfer position TP2. The second wafer W2 held by the first stage 52a is removed from above the first stage 52a by the transfer robot 23 at the standby position L1.

Figure 11A:
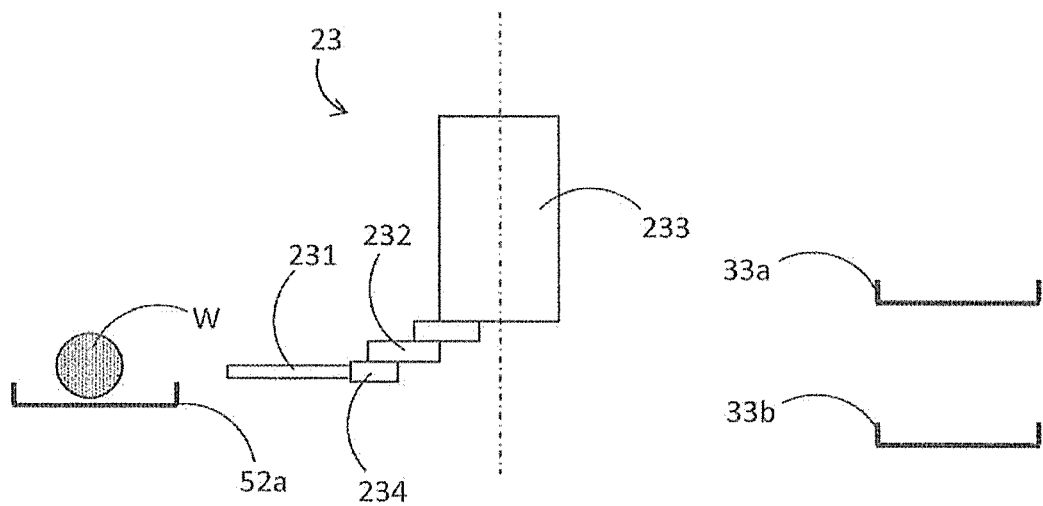
FIG. 11A is a schematic diagram for describing an action of the transfer robot with respect to a cleaning portion.

The content described above is repeated, and as shown in FIG. 11A, the wafer W held on the first stage 52a is removed from above the first stage 52a by the hand 231 of the transfer robot 23. After that, the hand 231 is inversed upside down together with the wafer W by the inversion mechanism 234 of the transfer robot 23.

Figure 11B:
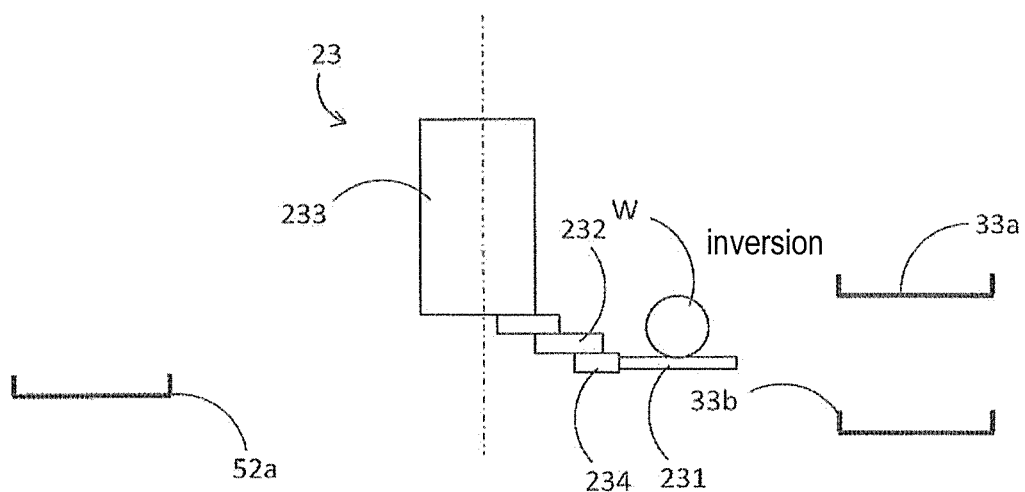
FIG. 11B is a schematic diagram for describing an action of the transfer robot with respect to the cleaning portion.
Figure 11C:
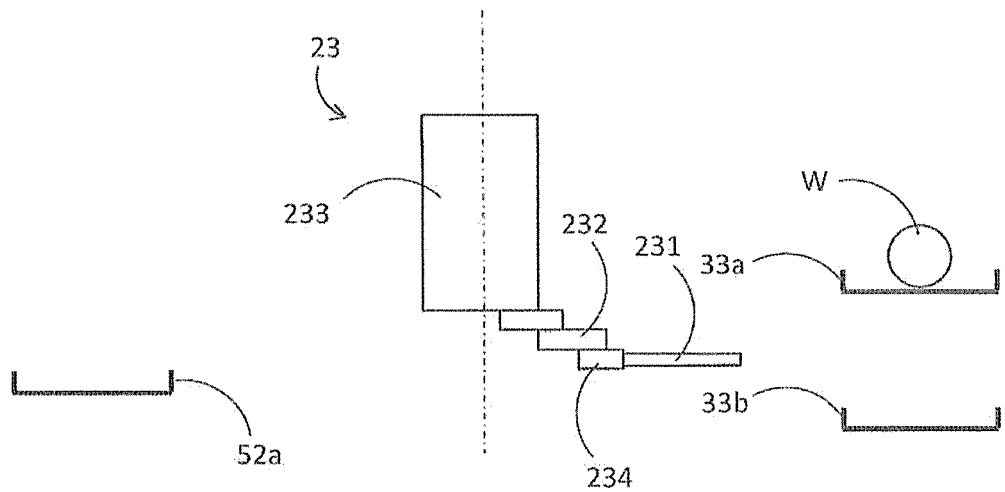
FIG. 11C is a schematic diagram for describing an action of the transfer robot with respect to the cleaning portion.

Next, as shown in FIG. 11B, the arm 232 of the transfer robot 23 is revolved around the axis line of the robot body 233, and the hand 231 is directed toward a first wafer station 33a side of the first cleaning unit 30a of the cleaning portion 13. Then, as shown in FIG. 11C, the arm 232 is extended, and the wafer W held by the hand 231 is delivered to the first wafer station 33a. More specifically, in a state that the hand 231 of the transfer robot 23 is positioned at the same height as a carrying-in port 73 of the first wafer station 33a, the arm 232 is extended, and the wafer W held by the hand 231 is carried into an inner side of a housing 71 through the carrying-in port 73 of the first wafer station 33a and is placed and supported on a stage 72.

Additionally, in a case in which the first cleaning unit 30a is congested or in other cases, the wafer W held by the hand 231 may be delivered to a second wafer station 33b of the second cleaning unit 30b. In the embodiment, the wafers W transferred from the polishing portion to the cleaning portion are distributed into the first cleaning unit 30a and the second cleaning unit 30b by the transfer robot 23, and are concurrently cleaned by the first cleaning unit 30a and the second cleaning unit 30b. Therefore, the throughput of the entire process is improved.

According to the embodiment as described above, the cleaning portion 13 has the first cleaning unit 30a and the second cleaning unit 30b arranged in upper and lower stages, and thus even when the plurality of wafers W are continuously transferred from the polishing portion 12 to the cleaning portion 13, these plurality of wafers W can be concurrently cleaned by distributing the wafers W into the first cleaning unit 30a and the second cleaning unit 30b. Therefore, the throughput of the entire process can be improved.

In addition, according to the embodiment, the wafer W before polishing is transferred from the slide stage 42 of the transfer portion 14 to the polishing portion 12, and thus the transfer robot 111 arranged in the loading/unloading portion 11 can be prevented from coming into contact with the polishing environment and being contaminated.

In addition, according to the embodiment, the transfer robot 23 is arranged to be adjacent to the transfer portion 14 and each of the first polishing unit 20a and the second polishing unit 20b, and the wafers W transferred from the transfer portion 14 to the polishing portion 12 are distributed into the first transfer unit 24a and the second transfer unit 24b by the transfer robot 23. Then, the wafer W is carried into the first polishing device 21a or the second polishing device 21b from the first transfer unit 24a, and the wafer W is carried into the third polishing device 21c or the fourth polishing device 21d from the second transfer unit 24b. In this way, the first polishing unit 20a and the second polishing unit 20b do not share the wafer carrying-in route, and thus the congestion when the wafers are carried into the first polishing unit 20a and the second polishing unit 20b is eliminated. Thereby, the throughput of the entire process can be improved.

In addition, according to the embodiment, the first transfer unit 24a of the polishing portion 12 can transfer the wafer W received from the transfer robot 23 to each of the first polishing device 21a and the second polishing device 21b. In addition, the second transfer unit 24b of the polishing portion 12 can transfer the wafer W received from the transfer robot 23 to each of the third polishing device 21c and the fourth polishing device 21d. For example, while the first stage 52a of the first transfer unit 24a receives a first wafer from the transfer robot 23 and moves to the first substrate transfer position TP1, the first pusher 51a is raised and delivers the first wafer from the first stage 52a to the first polishing device 21a, and the first wafer is polished by the first polishing device 21a, the second stage 52b can receive a second wafer from the transfer robot 23 and move to the second substrate transfer position TP2, the second pusher 51b can be raised and deliver the second wafer from the second stage 52b to the second polishing device 21b, and the second wafer can be polished by the second polishing device 21b. By concurrently polishing two wafers in this way, the throughput of the entire process can be improved.

In addition, according to the embodiment, because the exchanger 50 of the polishing portion 12 has the three stages 52a to 52c, for example, while both the first stage 52a and the second stage 52b are used for the wafer delivery to the first polishing device 21a and the second polishing device 21b, the third stage 52c can be made to stand by to receive the next wafer. Thereby, the start timing of the polishing processing for the next wafer can be made earlier, and the throughput can be further improved.

In addition, according to the embodiment, when the first wafer W1 and the second wafer W2 are polished by the first polishing device 21a and the second polishing device 21b concurrently (parallelly), the wafer delivery to both the first polishing device 21a and the second polishing device 21b is performed using the same third stage 52c, and the second stage 52b and the first stage 52a are dedicated to receiving the wafers from the first polishing device 21a and the second polishing device 21b respectively, and thus even if a trouble occurs when the wafer is received from one polishing device 21a, the wafer delivery to the other polishing device 21b can be continuously performed (the occurrence of the deadlock can be avoided).

Additionally, in the example shown in FIGS. 10A to 10P, the standby position L1 is positioned closer to the transfer robot 23 side than the first substrate transfer position TP1 and the second substrate transfer position TP2 (on a right side of the paper), but the disclosure is not limited to this position relationship, and the standby position L1 may be positioned between the first substrate transfer position TP1 and the second substrate transfer position TP2, or may be positioned on the side opposite to the transfer robot 23 with respect to the first substrate transfer position TP1 and the second substrate transfer position TP2 (on a left side of the paper).

<Timing of Removing Substrate from Cassette>

Next, the method for determining the timing of removing the substrate W from the cassette 113 in the substrate processing device 10 described above is described. The control portion 15 has the timetable in which the processing end time point or the scheduled processing end time point in the loading/unloading portion 11, the transfer portion 14, the polishing portion 12, and the cleaning portion 13 is associated with each substrate W, and based on the timetable, the timing of removing the substrate W from the cassette 113 is controlled. Additionally, in the following description, an aspect is described in which the timetable is created by the control portion 15 executing "the method for determining the timing of removing the substrate W from the cassette 113", but the disclosure is not limited thereto, and an aspect may also be adopted in which the timetable is created by an information processing device (a computer) separate from the control portion 15 executing "the method for determining the timing of removing the substrate W from the cassette 113", and the created timetable is set in the control portion 15.

The following description is given using an example in which the transfer robot 23 alternately distributes the substrates W transferred one by one from the transfer portion 12 into the first transfer unit 24a and the second transfer unit 24b, the first transfer unit 24a alternately distributes the substrates W received from the transfer robot 23 into the first polishing device 21a and the second polishing device 21b, and the first polishing device 21a and the second polishing device 21b process two wafers W concurrently (parallelly); similarly, the second transfer unit 24b alternately distributes the substrates W received from the transfer robot 23 into the third polishing device 21c and the fourth polishing device 21d, and the third polishing device 21c and the fourth polishing device 21d process two wafers W concurrently (parallelly). Specifically, for example, the (4j+1)th (j is an integer greater than or equal to 0) substrate W is distributed into the first transfer unit 24a by the transfer robot 23 and then polished by the first polishing device 21a, the (4j+2)th substrate W is distributed into the second transfer unit 24b by the transfer robot 23 and then polished by the third polishing device 21c, the (4j+3)th substrate W is distributed into the first transfer unit 24a by the transfer robot 23 and then polished by the second polishing device 21b, and the (4j+4)th substrate W is distributed into the second transfer unit 24b by the transfer robot 23 and then polished by the fourth polishing device 21d.

Figure 13:
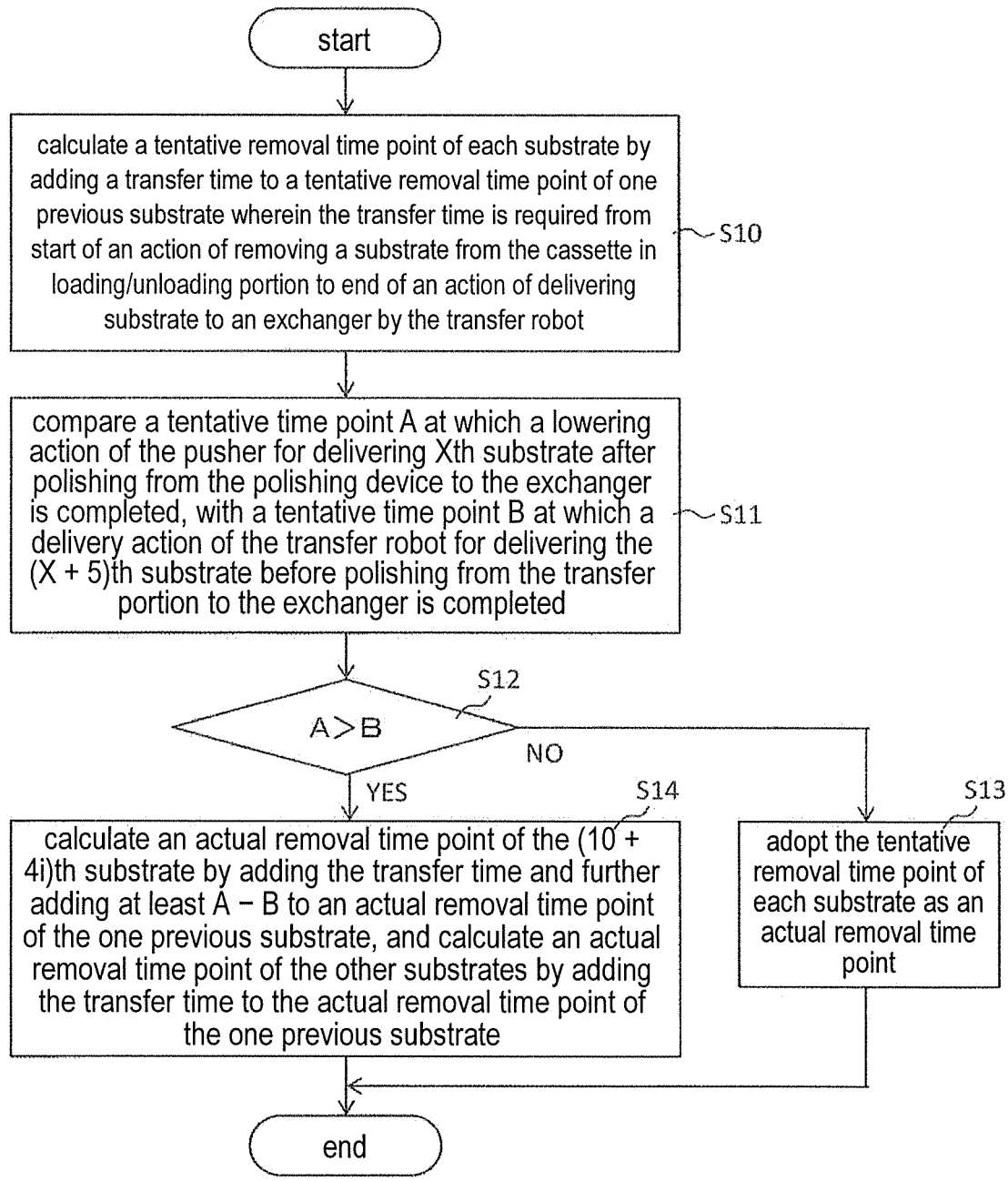
FIG. 13 is a flowchart showing an example of a method for determining a timing of removing a substrate from a cassette.
Figure 14:
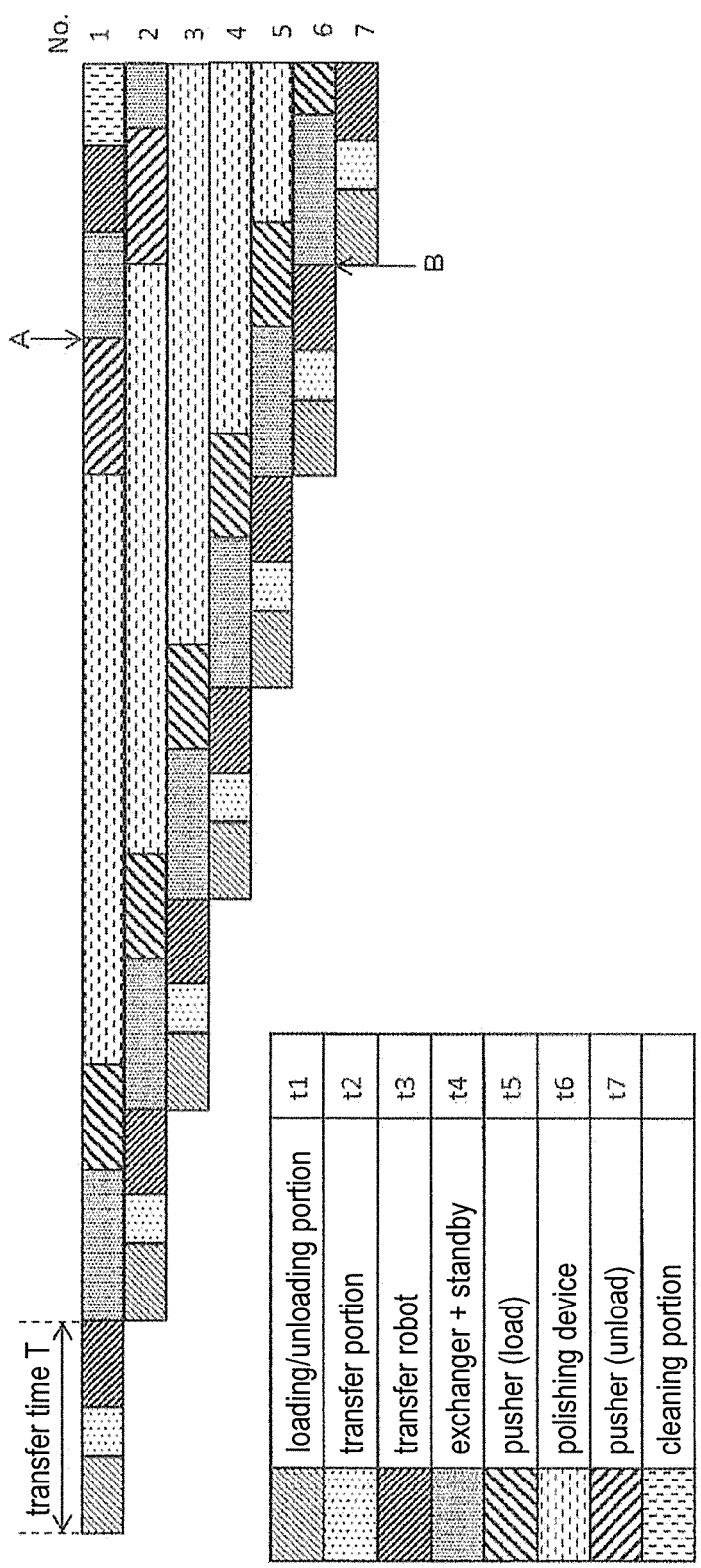
FIG. 14 is a time chart for describing the method for determining the timing of removing the substrate from the cassette.
Figure 15:
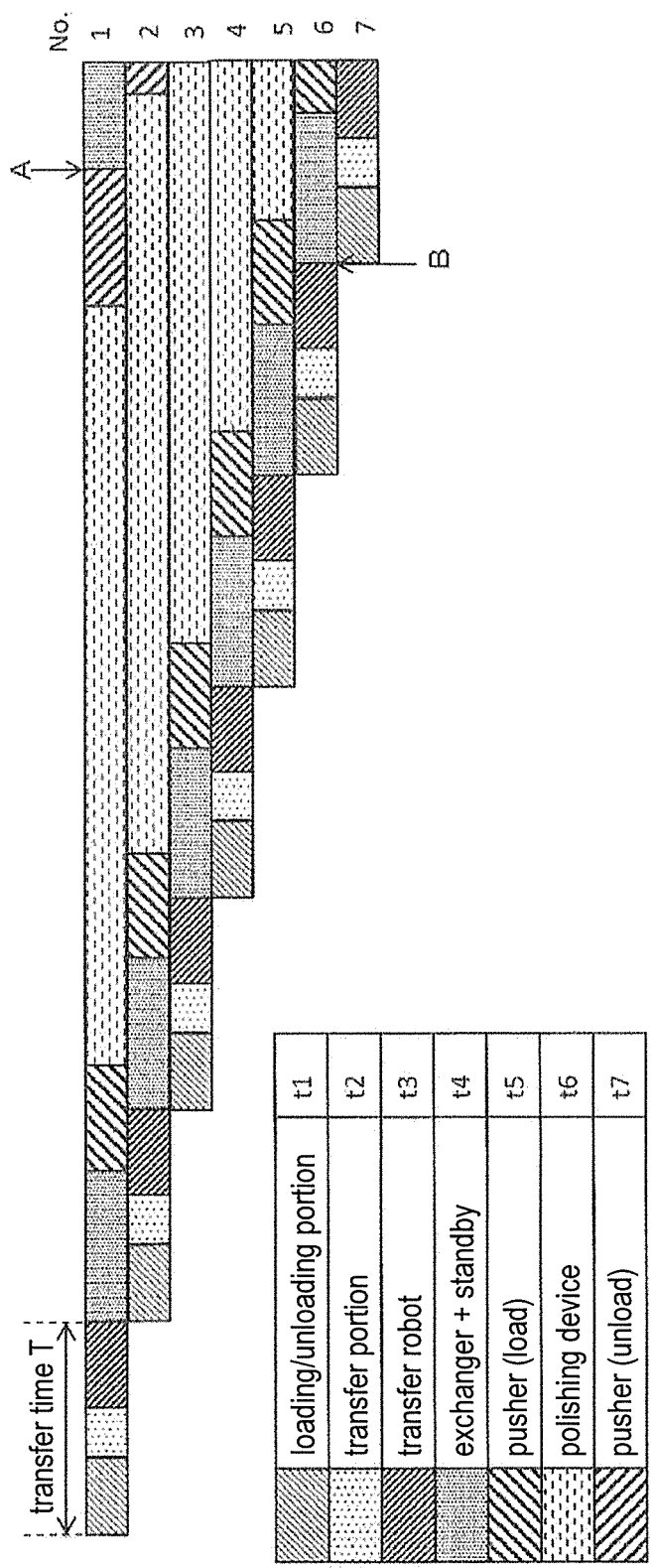
FIG. 15 is a time chart for describing the method for determining the timing of removing the substrate from the cassette.
Figure 16:
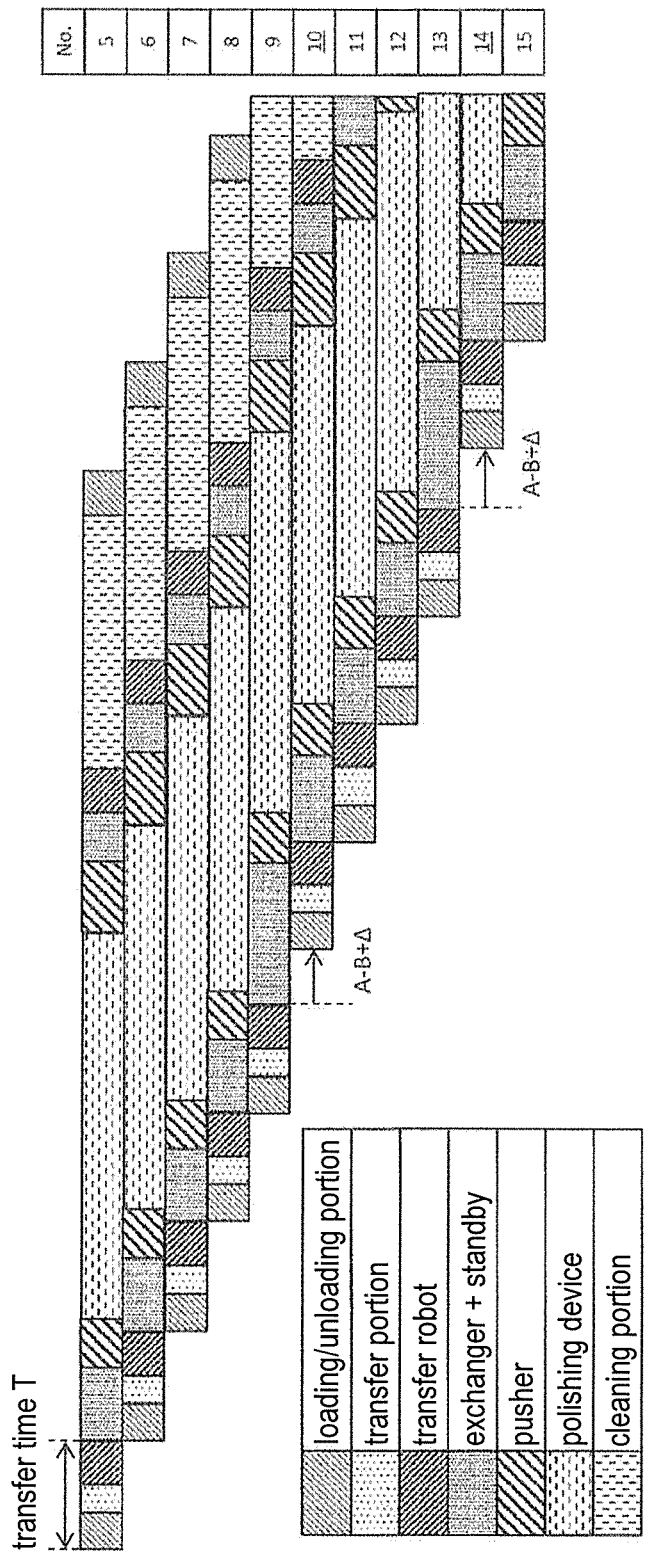
FIG. 16 is a time chart for describing the method for determining the timing of removing the substrate from the cassette.

FIG. 13 is a flowchart showing an example of the method for determining the timing of removing the substrate W from the cassette 113. FIGS. 14 to 16 are flowcharts for describing the method for determining the timing of removing the substrate W from the cassette 113.

As shown in FIG. 13, first, the control portion 15 calculates a tentative removal time point of each substrate W by adding a transfer time T to a tentative removal time point of the one previous substrate W, wherein the transfer time T required from the start of the action of removing the substrate W from the cassette 113 in the loading/unloading portion 11 to the end of the action of delivering the substrate W to the exchanger 50 by the transfer robot 23 (Step S10). For example, as shown in FIG. 14, the control portion 15 sets a tentative removal time point of the second substrate W as a time point obtained by adding the transfer time T to a tentative removal time point of the first substrate W, that is, a time point later than the tentative removal time point of the first substrate W by the transfer time T. Similarly, the control portion 15 sets a tentative removal time point of the third substrate W as a time point obtained by adding the transfer time T to the tentative removal time point of the second substrate W, that is, a time point later than the tentative removal time point of the second substrate W by the transfer time T. Similarly, the control portion 15 sets a tentative removal time point of the (k+1)th (k is a natural number) substrate W as a time point obtained by adding the transfer time T to a tentative removal time point of the kth substrate W, that is, a time point later than the tentative removal time point of the kth substrate W by the transfer time T.

Next, the control portion 15 compares a tentative time point A at which the lowering action of the pushers 51a and 51b for delivering the Xth (X is an arbitrary natural number) substrate W after polishing from the polishing devices 21a to 21d to the exchanger 50 is completed, with a tentative time point B at which the delivery action of the transfer robot 23 for delivering the (X+5)th substrate W before polishing from the transfer portion 14 to the exchanger 50 is completed (Step S11). For example, as shown in FIG. 14, the control portion 15 compares the tentative time point A at which the lowering action of the pushers 51a and 51b for delivering the first substrate W after polishing from the polishing devices 21a to 21d to the exchanger 50 is completed, with the tentative time point B at which the delivery action of the transfer robot 23 for delivering the fifth substrate W before polishing from the transfer portion 14 to the exchanger 50 is completed.

More specifically, for example, using a time t1 required from the start of the action of removing the substrate W from the cassette 113 in the loading/unloading portion 11 to the delivery of the substrate W to the transfer portion 14, a time t2 required for the transfer portion 14 from receiving the substrate W from the loading/unloading portion 11 to delivering the substrate W to the transfer robot 23, a time t3 required for the transfer robot 23 from receiving the substrate W from the transfer portion 14 to delivering the substrate W to the exchanger 50, a time t4 required for the exchanger 50 from receiving the substrate W from the transfer robot 23 to moving to the substrate delivery position, a time t5 required for the pushers 51a and 51b from the start to the end of the raising action (loading) for delivering the substrate W from the exchanger 50 to the polishing devices 21a to 21d, a time t6 required for the polishing devices 21a to 21d from receiving the substrate W from the pushers 51a and 51b to polishing the substrate W and then delivering the polished substrate W to the pushers 51a and 51b, and a time t7 required for the pushers 51a and 51b from the start to the end of the lowering action (unloading) for delivering the substrate W from the polishing devices 21a to 21d to the exchanger 50, the control portion 15 calculates the tentative time point A at which the lowering action of the pushers 51a and 51b for delivering the first substrate W after polishing from the polishing devices 21a to 21d to the exchanger 50 is completed by A=t1+t2+t3+t4+t5+t6+t7, calculates the tentative time point B at which the delivery action of the transfer robot 23 for delivering the fifth substrate W before polishing from the transfer portion 14 to the exchanger 50 is completed by B=(t1+t2+t3)×6, and compares A with B. Here, t1, t2, t3, t4, t5, and t7 are fixed times required for the transfer, while t6 is a time that can be arbitrarily changed according to the content of the polishing recipe, user settings, and the like. Therefore, as shown in FIG. 14, when t6 is set as a relatively short time, A<B may be satisfied. Conversely, as shown in FIG. 15, when t6 is set as a relatively long time, A>B may be satisfied.

As shown in FIG. 14, when A≤B (that is, B is concurrent with A or B is later than A) (Step S12: NO), the control portion 15 adopts the tentative removal time point of each substrate W as the actual removal time point (Step S13).

On the other hand, as shown in FIG. 15, when A>B (that is, B is earlier than A) (Step S12: YES), as shown in FIG. 16, the control portion 15 calculates an actual removal time point of the (10+4i)th (i is a natural number greater than or equal to 0) substrate W (that is, the 10th, 14th, 18th, . . . substrate) by adding the transfer time T described above and further adding at least A−B to an actual removal time point of the one previous substrate W (that is, the 9th, 13th, 17th, . . . substrate), and calculates an actual removal time point of the other substrates W (that is, the 1st to 9th, 11th to 13th, 15th to 17th, . . . substrates) by adding the transfer time T described above to an actual removal time point of the one previous substrate W (Step S14). The reasons for applying at least the correction of A−B to the removal time point of the (10+4i)th substrate are as follow. That is, (1) at the time of the fastest input, for the 1st to 4th substrates W, there is no waiting time in the exchanger 50 before the raising action (loading) of the pushers 51a and 51b for delivering the substrate W from the exchanger 50 to the polishing devices 21a to 21d (that is, from the time when the exchanger 50 receives the substrate W from the transfer robot 23 to the time when the exchanger 50 moves to the substrate delivery position). (2) In order to maximize WPH, there is a waiting time in the exchanger 50 for the fifth or subsequent substrate W before the loading of the pushers 51a and 51b. (3) The substrate influenced by the waiting time of (2) is the ninth or subsequent substrate W, and every fourth substrate W thereafter is influenced (that is, the 9th, 13th, 17th, . . . substrate is influenced). (4) The fifth or subsequent substrate W which contributes to the maximization of WPH is the tenth or subsequent substrate W which is the next substrate of the 9th, 13th, 17th, . . . substrate influenced by the waiting time of (2) and subjected to transfer disturbance (that is, the 10th, 14th, 18th, . . . substrate). Therefore, the correction for the removal time point of the substrate is applied to the (10+4i)th substrate W (that is, the 10th, 14th, 18th, . . . substrate).

When A>B, the control portion 15 may calculate the actual removal time point of the (10+4i)th substrate W by adding the transfer time T described above to the actual removal time point of the one previous substrate W and further adding A−B+Δ, and calculate the actual removal time point of the other substrates W by adding the transfer time T described above to the actual removal time point of the one previous substrate W. Here, Δ is a predetermined value in consideration of the delay of a communication time in an actual machine, and may be, for example, 1 second or less, 0.8 seconds or less, or 0.6 seconds or less. The reason for considering the item Δ is that when a transfer result examined in advance by a simulator is compared with a result of the actual transfer by the actual machine, an error corresponding to the communication time occurs during the transfer in the actual machine. By adding this error time, the transfer timing in the actual machine can be strictly corrected, and the transfer having the maximum WPH can be performed.

For example, as shown in FIG. 16, when A>B, the control portion 15 sets an actual removal time point of the tenth substrate W as a time point obtained by adding the transfer time T described above and further adding A−B+Δ to the actual removal time point of the ninth substrate W, that is, a time point later than the actual removal time point of the ninth substrate W by T+A−B+Δ. Next, the control portion 15 sets an actual removal time point of the 11th substrate W as a time point obtained by adding the transfer time T described above to the actual removal time point of the tenth substrate W, that is, a time point later than the actual removal time point of the tenth substrate W by T. Next, the control portion 15 sets an actual removal time point of the 12th substrate W as a time point obtained by adding the transfer time T described above to the actual removal time point of the 11th substrate W, that is, a time point later than the actual removal time point of the 11th substrate W by T. Next, the control portion 15 sets an actual removal time point of the 13th substrate W as a time point obtained by adding the transfer time T described above to the actual removal time point of the 12th substrate W, that is, a time point later than the actual removal time point of the 12th substrate W by T. Next, the control portion 15 sets an actual removal time point of the 14th substrate W as a time point obtained by adding the transfer time T described above and further adding A−B+Δ to the actual removal time point of the 13th substrate W, that is, a time point later than the actual removal time point of the 13th substrate W by T+A−B+Δ.

According to the embodiment as described above, as shown in FIG. 16, immediately after the lowering action (unloading) of the pushers 51a and 51b for delivering the (10+4(i−1))th substrate W after polishing from the polishing devices 21a to 21d to the exchanger 50 is completed, the substrate W is stabilized, and the raising action (loading) of the same pushers 51a and 51b for delivering the (10+4i)th substrate W before polishing from the exchanger 50 to the polishing devices 21a to 21d can be started. Similarly, immediately after the lowering action (unloading) of the pushers 51a and 51b for delivering the (10+4(i−1)+k)th (k=1, 2, 3) substrate W after polishing from the polishing devices 21a to 21d to the exchanger 50 is completed, the substrate W is stabilized, and the raising action (loading) of the same pushers 51a and 51b for delivering the (10+4i+k)th substrate W before polishing from the exchanger 50 to the polishing devices 21a to 21d can be started. Therefore, the pusher-to-pusher action time (the time from the start of one processing for the substrate W executed by the pushers 51a and 51b to the start of another processing for the substrate W next thereto) can be shorten, and thereby the rate controlling of the polishing portion 12 can be minimized, and the throughput (WPH: Wafer Per Hour) can be improved. In addition, accordingly, the time from polishing to cleaning becomes uniform and the shortest for each wafer W, and thus it is also possible to achieve a high level of stability in terms of process.

The embodiment and the variation example of the disclosure are described above in an illustrative manner, but the scope of the disclosure is not limited thereto, and changes/modifications can be made according to the purpose within the scope described in claims. In addition, each embodiment and variation example can be appropriately combined within a scope in which the processing contents do not contradict each other.

In addition, the device for determining a timing of removing a substrate from a cassette according to the embodiment can be configured by one or more computers, and a program for enabling one or more computers to implement the device for determining a timing of removing a substrate from a cassette and a recording medium in which the program is recorded are also protected by the disclosure.

What is claimed is:

1. A method, for determining a timing of removing a substrate from a cassette in a substrate processing device, wherein the substrate processing device comprises:
   a polishing portion comprising a first polishing unit, a second polishing unit, and a transfer robot which distributes substrates into the first polishing unit and the second polishing unit, wherein each of the first polishing unit and the second polishing unit comprises two polishing devices, two pushers which are respectively arranged at two substrate transfer positions for each of the two polishing devices and move up and down, and an exchanger having stages that horizontally move between a standby position for delivering a substrate to the transfer robot and the two substrate transfer positions;
a loading/unloading portion comprising a transfer robot which removes a substrate before polishing from the cassette and is assembled independently; and
a transfer portion comprising a slide stage which transfers a substrate between the loading/unloading portion and the transfer robot and is assembled independently;
wherein a tentative removal time point of each substrate is calculated by adding a transfer time to a tentative removal time point of one previous substrate, wherein the transfer time is required from start of an action of removing a substrate from the cassette in the loading/unloading portion to end of an action of delivering the substrate to the exchanger by the transfer robot,
a tentative time point A at which a lowering action of each of the pushers of each of the first polishing unit and the second polishing unit for delivering a Xth (X is an arbitrary natural number) substrate after polishing from each of the polishing devices of each of the first polishing unit and the second polishing unit to the exchanger is completed is compared with a tentative time point B at which a delivery action of the transfer robot for delivering a (X+5)th substrate before polishing from the transfer portion to the exchanger is completed,
when A≤B, the tentative removal time point of each substrate is adopted as an actual removal time point, and
when A>B, an actual removal time point of a (10+4i)th (i is an integer greater than or equal to 0) substrate is calculated by adding the transfer time and further adding at least A−B to an actual removal time point of the one previous substrate, and an actual removal time point of the other substrates is calculated by adding the transfer time to the actual removal time point of the one previous substrate, and the method comprising:
controlling the timing of removing the substrate from the cassette based on the actual removal time point in the polishing portion, the loading/unloading portion, and the transfer portion associated with each substrate.

2. The method according to claim 1,
wherein when A>B, the actual removal time point of the (10+4i)th substrate is calculated by adding the transfer time and further adding A−B+Δ to the actual removal time point of the one previous substrate, and the actual removal time point of the other substrates is calculated by adding the transfer time to the actual removal time point of the one previous substrate, and
the Δ is a predetermined value in consideration of a delay of a communication time in an actual machine.

3. The method according to claim 2,
wherein the Δ is 1 second or less.

4. The method according to claim 3,
wherein the substrate processing device further comprises a cleaning portion comprising a wafer station which cleans a substrate after polishing and is assembled independently, and
the transfer robot delivers a substrate between the first polishing unit and the cleaning portion and between the second polishing unit and the cleaning portion.

5. The method according to claim 2,
wherein the substrate processing device further comprises a cleaning portion comprising a wafer station which cleans a substrate after polishing and is assembled independently, and
the transfer robot delivers a substrate between the first polishing unit and the cleaning portion and between the second polishing unit and the cleaning portion.

6. The method according to claim 1,
wherein the substrate processing device further comprises a cleaning portion comprising a wafer station which cleans a substrate after polishing and is assembled independently, and
the transfer robot delivers a substrate between the first polishing unit and the cleaning portion and between the second polishing unit and the cleaning portion.

7. A device, which determines a timing of removing a substrate from a cassette in a substrate processing device,
wherein the substrate processing device comprises:
a polishing portion comprising a first polishing unit, a second polishing unit, and a transfer robot which distributes substrates into the first polishing unit and the second polishing unit, wherein each of the first polishing unit and the second polishing unit comprises two polishing devices, two pushers which are respectively arranged at two substrate transfer positions for each of the two polishing devices and move up and down, and an exchanger having stages that horizontally move between a standby position for delivering a substrate to the transfer robot and the two substrate transfer positions;
a loading/unloading portion comprising a transfer robot which removes a substrate before polishing from the cassette and the loading/unloading portion is assembled independently; and
a transfer portion comprising a slide stage which transfers a substrate between the loading/unloading portion and the transfer robot and the transfer portion is assembled independently;
wherein the device comprises:
a memory which stores an instruction; and
at least one processor configured to execute the instruction, which is for:
calculating a tentative removal time point of each substrate by adding a transfer time to a tentative removal time point of one previous substrate, wherein the transfer time is required from start of an action of removing a substrate from the cassette in the loading/unloading portion to end of an action of delivering the substrate to the exchanger by the transfer robot;
comparing a tentative time point A at which a lowering action of each of the pushers of each of the first polishing unit and the second polishing unit for delivering a Xth (X is an arbitrary natural number) substrate after polishing from each of the polishing devices of each of the first polishing unit and the second polishing unit to the exchanger is completed with a tentative time point B at which a delivery action of the transfer robot for delivering a (X+5)th substrate before polishing from the transfer portion to the exchanger is completed;
when A≤B, adopting the tentative removal time point of each substrate as an actual removal time point; and
when A>B, calculating an actual removal time point of a (10+4i)th (i is an integer greater than or equal to 0) substrate by adding the transfer time and further adding at least A−B to an actual removal time point of the one previous substrate, and calculating an actual removal time point of the other substrates by adding the transfer time to the actual removal time point of the one previous substrate; and controlling the timing of removing the substrate from the cassette based on the actual removal time point in the polishing portion, the loading/unloading portion, and the transfer portion associated with each substrate.

8. The device according to claim 7,
which calculates the actual removal time point of the (10+4i)th substrate by adding the transfer time and further adding A−B+Δ to the actual removal time point of the one previous substrate, and calculates the actual removal time point of the other substrates by adding the transfer time to the actual removal time point of the one previous substrate when A>B,
wherein the Δ is a predetermined value in consideration of a delay of a communication time in an actual machine.

9. The device according to claim 8,
wherein the Δ is 1 second or less.

10. The device according to claim 9,
wherein the substrate processing device further comprises a cleaning portion comprising a wafer station which cleans a substrate after polishing and is assembled independently, and
the transfer robot delivers a substrate between the first polishing unit and the cleaning portion and between the second polishing unit and the cleaning portion.

11. The device according to claim 8,
wherein the substrate processing device further comprises a cleaning portion comprising a wafer station which cleans a substrate after polishing and is assembled independently, and
the transfer robot delivers a substrate between the first polishing unit and the cleaning portion and between the second polishing unit and the cleaning portion.

12. The device according to claim 7,
wherein the substrate processing device further comprises a cleaning portion comprising a wafer station which cleans a substrate after polishing and is assembled independently, and
the transfer robot delivers a substrate between the first polishing unit and the cleaning portion and between the second polishing unit and the cleaning portion.

13. A non-transitory computer readable medium, storing a program, for determining a timing of removing a substrate from a cassette in a substrate processing device,
wherein the substrate processing device comprises:
a polishing portion comprising a first polishing unit, a second polishing unit, and a transfer robot which distributes substrates into the first polishing unit and the second polishing unit, wherein each of the first polishing unit and the second polishing unit comprises two polishing devices, two pushers which are respectively arranged at two substrate transfer positions for each of the two polishing devices and move up and down, and an exchanger having stages that horizontally move between a standby position for delivering a substrate to the transfer robot and the two substrate transfer positions;
a loading/unloading portion comprising a transfer robot which removes a substrate before polishing from the cassette and the loading/unloading portion is assembled independently; and
a transfer portion comprising a slide stage which transfers a substrate between the loading/unloading portion and the transfer robot and the transfer portion is assembled independently, wherein the program causes a computer to execute:
calculation of a tentative removal time point of each substrate by adding a transfer time to a tentative removal time point of one previous substrate, wherein the transfer time is required from start of an action of removing a substrate from the cassette in the loading/unloading portion to end of an action of delivering the substrate to the exchanger by the transfer robot;
comparison of a tentative time point A at which a lowering action of each of the pushers of each of the first polishing unit and the second polishing unit for delivering a Xth (X is an arbitrary natural number) substrate after polishing from each of the polishing devices of each of the first polishing unit and the second polishing unit to the exchanger is completed with a tentative time point B at which a delivery action of the transfer robot for delivering a (X+5)th substrate before polishing from the transfer portion to the exchanger is completed;
adoption of the tentative removal time point of each substrate as an actual removal time point when A≤B; and
calculation of an actual removal time point of a (10+4i)th (i is an integer greater than or equal to 0) substrate by adding the transfer time and further adding at least A−B to an actual removal time point of the one previous substrate, and calculation of an actual removal time point of the other substrates by adding the transfer time to the actual removal time point of the one previous substrate when A>B; and
controlling the timing of removing the substrate from the cassette based on the actual removal time point in the polishing portion, the loading/unloading portion, and the transfer portion associated with each substrate.

14. The non-transitory computer readable medium according to claim 13,
wherein when A>B, the actual removal time point of the (10+4i)th substrate is calculated by adding the transfer time and further adding A−B+Δ to the actual removal time point of the one previous substrate, and the actual removal time point of the other substrates is calculated by adding the transfer time to the actual removal time point of the one previous substrate, and
the Δ is a predetermined value in consideration of a delay of a communication time in an actual machine.

15. The non-transitory computer readable medium according to claim 14,
wherein the Δ is 1 second or less.

16. The non-transitory computer readable medium according to claim 15,
wherein the substrate processing device further comprises a cleaning portion comprising a wafer station which cleans a substrate after polishing and is assembled independently, and
the transfer robot delivers a substrate between the first polishing unit and the cleaning portion and between the second polishing unit and the cleaning portion.

17. The non-transitory computer readable medium according to claim 14,
wherein the substrate processing device further comprises a cleaning portion comprising a wafer station which cleans a substrate after polishing and is assembled independently, and
the transfer robot delivers a substrate between the first polishing unit and the cleaning portion and between the second polishing unit and the cleaning portion.

18. The non-transitory computer readable medium according to claim 13, wherein the substrate processing device further comprises
a cleaning portion comprising a wafer station which cleans a substrate after polishing and is assembled independently, and
the transfer robot delivers a substrate between the first polishing unit and the cleaning portion and between the second polishing unit and the cleaning portion.

19. A substrate processing device, comprising:
a polishing portion comprising a first polishing unit, a second polishing unit, and a transfer robot which distributes substrates into the first polishing unit and the second polishing unit, wherein each of the first polishing unit and the second polishing unit comprises two polishing devices, two pushers which are respectively arranged at two substrate transfer positions for each of the two polishing devices and move up and down, and an exchanger having stages that horizontally move between a standby position for delivering a substrate to the transfer robot and the two substrate transfer positions;
a loading/unloading portion comprising a transfer robot which removes a substrate before polishing from a cassette and the loading/unloading portion is assembled independently;
a transfer portion comprising a slide stage which transfers a substrate between the loading/unloading portion and the transfer robot and the transfer portion is assembled independently; and
a control panel which controls a timing of removing a substrate from the cassette based on a timetable in which a processing end time point or a scheduled processing end time point in the polishing portion, the loading/unloading portion, and the transfer portion is associated with each substrate;
wherein in the timetable,
between a time point A at which a lowering action of each of the pushers of each of the first polishing unit and the second polishing unit for delivering a Xth (X is an arbitrary natural number) substrate after polishing from each of the polishing devices of each of the first polishing unit and the second polishing unit to the exchanger is completed, and a time point B at which a delivery action of the transfer robot for delivering a (X+5)th substrate before polishing from the transfer portion to the exchanger is completed, there is a relationship of A>B, and
a removal time point of a (10+4i)th (i is an integer greater than or equal to 0) substrate is a time point obtained by adding a transfer time, which is required from start of an action of removing a substrate from the cassette in the loading/unloading portion to end of an action of delivering the substrate to the exchanger by the transfer robot, and further adding at least A−B to a removal time point of one previous substrate, and a removal time point of the other substrates is a time point obtained by adding the transfer time to the removal time point of the one previous substrate.

20. The substrate processing device according to claim 19,
wherein in the timetable,
the actual removal time point of the (10+4i)th substrate is a time point obtained by adding the transfer time and further adding A−B+Δ to the removal time point of the one previous substrate, and the actual removal time point of the other substrates is a time point obtained by adding the transfer time to the removal time point of the one previous substrate, and
the Δ is a predetermined value in consideration of a delay of a communication time in an actual machine.

21. The substrate processing device according to claim 20,
wherein the Δ is 1 second or less.

22. The substrate processing device according to claim 21, further comprising
a cleaning portion comprising a wafer station which cleans a substrate after polishing and is assembled independently,
wherein the transfer robot delivers a substrate between the first polishing unit and the cleaning portion and between the second polishing unit and the cleaning portion.

23. The substrate processing device according to claim 20, further comprising
a cleaning portion comprising a wafer station which cleans a substrate after polishing and is assembled independently,
wherein the transfer robot delivers a substrate between the first polishing unit and the cleaning portion and between the second polishing unit and the cleaning portion.

24. The substrate processing device according to claim 19, further comprising
a cleaning portion comprising a wafer station which cleans a substrate after polishing and is assembled independently,
wherein the transfer robot delivers a substrate between the first polishing unit and the cleaning portion and between the second polishing unit and the cleaning portion.

* * * * *